(12) United States Patent
Xu et al.

(10) Patent No.: US 11,869,600 B2
(45) Date of Patent: Jan. 9, 2024

(54) MEMORY CELL SENSING BY CHARGE SHARING BETWEEN SENSING NODES

(71) Applicant: SanDisk Technologies LLC, Addison, TX (US)

(72) Inventors: Jiawei Xu, San Jose, CA (US); Anirudh Amarnath, San Jose, CA (US); Hiroki Yabe, Yokohama (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 114 days.

(21) Appl. No.: 17/689,188

(22) Filed: Mar. 8, 2022

(65) Prior Publication Data

US 2023/0290415 A1   Sep. 14, 2023

(51) Int. Cl.
*G11C 16/26*    (2006.01)
*G11C 16/10*    (2006.01)
*G11C 16/04*    (2006.01)

(52) U.S. Cl.
CPC .......... *G11C 16/26* (2013.01); *G11C 16/0483* (2013.01); *G11C 16/10* (2013.01)

(58) Field of Classification Search
CPC ...... G11C 16/26; G11C 16/0483; G11C 16/10
See application file for complete search history.

(56) References Cited

U.S. PATENT DOCUMENTS

| | | | |
|---|---|---|---|
| 4,901,280 A | * | 2/1990 | Patel ................... G11C 11/4085 365/189.11 |
| 2002/0131298 A1 | * | 9/2002 | Barnes ................... G11C 7/065 365/181 |
| 2004/0052140 A1 | * | 3/2004 | Chae ..................... G11C 7/1069 365/205 |

* cited by examiner

*Primary Examiner* — Sultana Begum
(74) *Attorney, Agent, or Firm* — Hector A. Agdeppa; SHEPPARD MULLIN RICHTER & HAMPTON LLP

(57) ABSTRACT

Memory cell sensing by charge sharing between two sense nodes is disclosed. A first sense node and a second sense node are pre-charged and the second node is discharged initiating charge sharing between the first sense node and the second sense node that results in an improved sense margin. Sensing circuitry disclosed herein may include one or more pre-charge circuits, sense enable circuits, and charge-sharing circuits. The increased sense margin achieved by sensing circuitry disclosed herein provides better noise immunity and more accurate sensing results.

20 Claims, 20 Drawing Sheets

MEMORY CELL SENSING BY CHARGE SHARING BETWEEN SENSING NODES

DESCRIPTION OF RELATED ART

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM). A stored value in memory cells (e.g. of NAND-string for NAND-type memory) can be read by sensing if a high current (generally the memory cell is ON), or low/no current (generally that the memory cell is OFF) is drawn by the memory cell.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

The figures are not exhaustive and do not limit the present disclosure to the precise form disclosed.

DETAILED DESCRIPTION

The accuracy of memory cell sensing can be dependent on the sensing time—also referred to as sense margin. As NAND Flash memory transitions from triple-level cells (TLC) (flash memory that stores three bits of data per cell) to quad-level cells (QLC) (flash memory that stores four bits of data per cell) and to even higher level cell technology (e.g., penta-level cell flash memory that stores five bits per cell), read sensitivity to the sensing time may increase. TLC cells, for example, may need to be able to sense eight different voltage levels (representing different combinations of bits) from a fixed range of voltages and program a memory cell with any of the voltages to store information in the memory cell. In QLC flash technology, 16 levels may need to be sensed from the same range of voltages. In either case, the window from which voltage levels are selected may be the same (e.g. a 5V window range). As such, QLC configurations, for example, may be more sensitive to variation, which can increase the fail bit count. Across a range of sensing times, for example, the fail bit count per block (i.e. number of error bits per block after sensing) may be more uniform in TLC configurations than in QLC configurations. Stated another way, the fail bit count for a QLC block may be more vulnerable to tighter sense margins than for a TLC memory block. Accordingly, there exists a need for sensing circuitry with improved sense margin.

Aspects of the disclosed technology relate to memory cell sensing by charge sharing between two sense nodes. In particular, example embodiments of the disclosed technology provide for memory cell sensing with increased sense margin, by pre-charging a first sense node and a second sense node, discharging the first sense node, sharing charge from the second sense node to the first sense node, and detecting the voltage level of the second sense node.

Sensing circuitry disclosed herein may include one or more pre-charge circuits, sense enable circuits, and charge-sharing circuits. Embodiments of the disclosed technology include sensing circuitry with increased and/or improved sense margin. As described in more detail herein, increased and/or improved sense margin can provide better noise immunity and more accurate sensing results. As such, embodiments of the disclosed technology permit the accuracy of products to be less sensitive to a bit-line settling time. With respect to QLC products, for example, increased sense margin can result in performance gains of 0.2 MB/s to 0.8 MB/s as well as improved noise immunity. Further, embodiments of the disclosed technology also allow for tighter distributions in view of variations in threshold voltages for switching devices.

Figure 1:
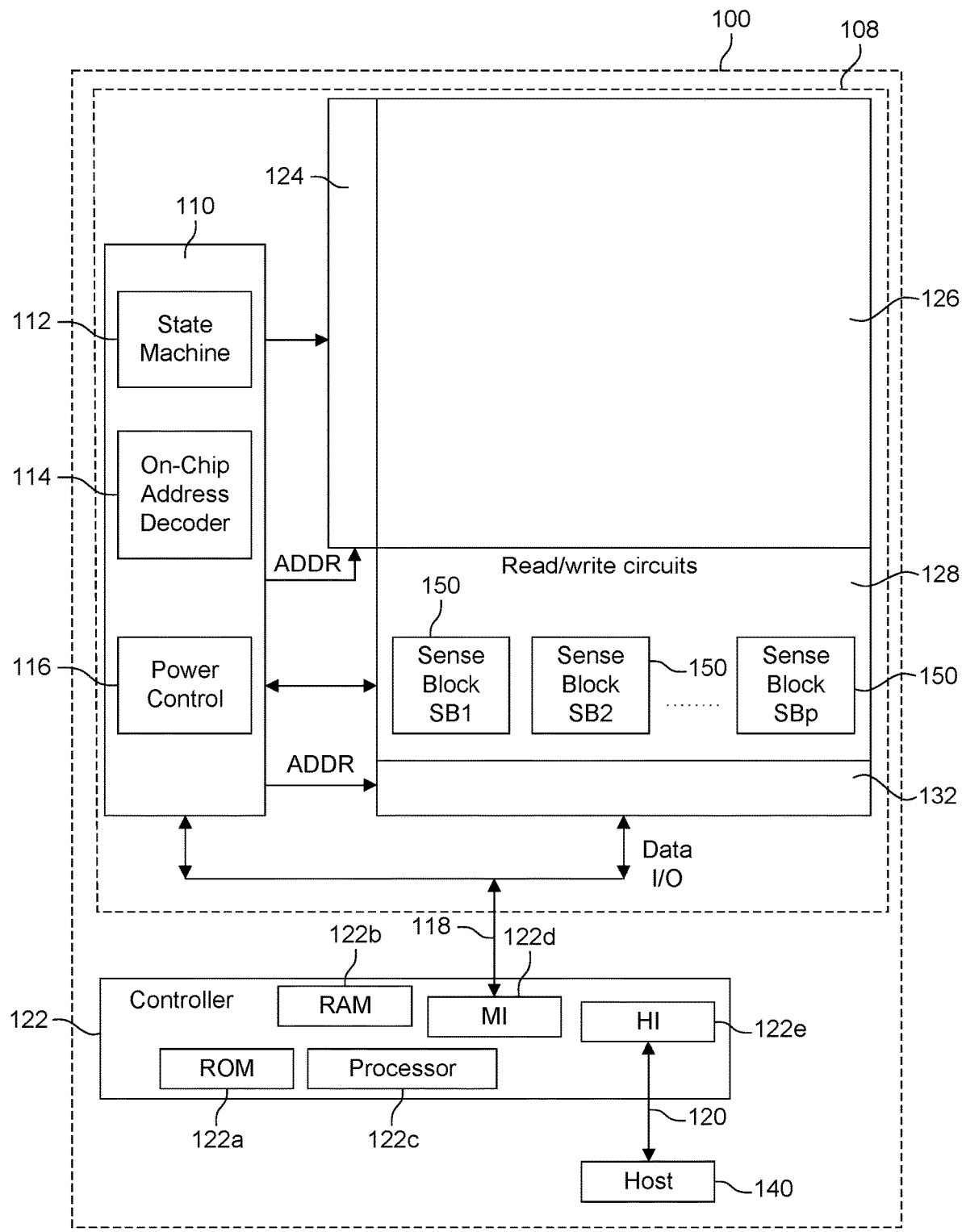
FIG. 1 is a block diagram of an example memory device, in connection with which, example embodiments of the disclosed technology can be implemented.

FIGS. 1 to 4G depict an example memory system that can be used to implement the technology disclosed herein. FIG. 1 is a functional block diagram of an example memory system 100. The components depicted in FIG. 1 are electrical circuits. Memory system 100 includes one or more memory dies 108, referred to hereinafter in the singular for ease of explanation. The memory die 108 can be a complete memory die or a partial memory die. In one embodiment, each memory die 108 includes a memory structure 126, control circuitry 110, and read/write circuits 128. Memory structure 126 is addressable by word-lines via a row decoder 124 and by bitlines via a column decoder 132. The read/write/erase circuits 128 include multiple sense blocks 150 including SB1, SB2, . . . , SBp (sensing circuitry) and allow a page of memory cells to be read or programmed in parallel. Also, many strings of memory cells can be erased in parallel.

In some systems, a controller 122 is included in the same package (e.g., a removable storage card) as the memory die 108. However, in other systems, the controller can be separated from the memory die 108. In some embodiments the controller is on a different die than the memory die 108. In some embodiments, one controller 122 communicates with multiple memory dies 108. In other embodiments, each memory die 108 has its own controller. Commands and data are transferred between a host 140 and controller 122 via a data bus 120, and between controller 122 and the memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, erase) on memory structure 126, and includes state machine 112, an on-chip address decoder 114, and a power control circuit 116. In one embodiment, control circuitry 110 includes buffers such as registers, read-only memory (ROM) fuses and other storage devices for storing default values such as base voltages and other parameters.

The on-chip address decoder 114 provides an address interface between addresses used by host 140 or controller 122 and the hardware address used by the decoders 124 and 132. Power control circuit 116 controls the power and voltages supplied to the wordlines, bitlines, and select lines during memory operations. The power control circuit 116 includes voltage circuitry, in one embodiment. Power control circuit 116 may include charge pumps for creating voltages. The sense blocks 150 include bitline drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered a control circuit that performs the functions described herein. Such a control circuit can include hardware only or a combination of hardware and software (including firmware). For example, a controller programmed by firmware to perform the functions described herein is one example of a control circuit. A control circuit can include a processor, a PGA (Programmable Gate Array), an FPGA (Field Programmable Gate Array), an ASIC (Application Specific Integrated Circuit), or another type of integrated circuit or circuit more generally.

The (on-chip or off-chip) controller 122 (which in one embodiment is an electrical circuit) may comprise one or more processors 122c, ROM 122a, random access memory (RAM) 122b, a memory interface (MI) 122d, and a host interface (HI) 122e, all of which may be interconnected. The storage devices (ROM 122a, RAM 122b) store code (software) such as a set of instructions (including firmware), and one or more of the processors 122c are operable to execute the set of instructions to provide functionality described herein. Alternatively or additionally, one or more processors 122c can access code from a storage device in the memory structure, such as a reserved area of memory cells connected to one or more wordlines. RAM 122b can be used to store data for controller 122, including caching program data (discussed below). MI 122d—in communication with ROM 122a, RAM 122b, and processor(s) 122c—may be an electrical circuit that provides an electrical interface between controller 122 and memory die 108. For example, MI 122d can change the format or timing of signals, provide a buffer, isolate from surges, latch I/O, etc. One or more processors 122c can issue commands to control circuitry 110 (or another component of memory die 108) via MI 122d. Host interface 122e provides an electrical interface with host 140 via data bus 120 in order to receive commands, addresses and/or data from host 140 to provide data and/or status to host 140.

In one embodiment, memory structure 126 comprises a three-dimensional (3D) memory array of non-volatile memory cells in which multiple memory levels are formed above a single substrate, such as a wafer. The memory structure may comprise any type of non-volatile memory monolithically formed in one or more physical levels of arrays of memory cells having an active area disposed above a silicon (or other type of) substrate. In one example, the non-volatile memory cells comprise vertical NAND strings with charge-trapping material. In another embodiment, memory structure 126 comprises a two-dimensional (2D) memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include resistive random access memory (ReRAM) memories, magnetoresistive RAM (MRAM) memory (e.g., MRAM, Spin Transfer Torque MRAM, Spin Orbit Torque MRAM), phase change memory (PCM), and the like. Examples of suitable technologies for memory cell architectures of the memory structure 126 include 2D arrays, 3D arrays, cross-point arrays, stacked 2D arrays, vertical bitline arrays, and the like.

Cross point memory—one example of a ReRAM or PCM RAM—includes reversible resistance-switching elements arranged in cross point arrays accessed by X lines and Y lines (e.g., wordlines and bitlines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one that is relatively inert (e.g., tungsten) and the other of which is electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

MRAM stores data within magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device can be built from a grid of such memory cells. In one embodiment for programming, each memory cell lies between a pair of write lines arranged at right angles to each other, parallel to the cell, one above and one below the cell. When current is passed through them, an induced magnetic field is created.

PCM exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). As such, the programming doses are laser pulses. The memory cells can be inhibited by blocking the memory cells from receiving the light. Note that the use of "pulse" in this document does not require a square pulse, but also includes a continuous (or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2:
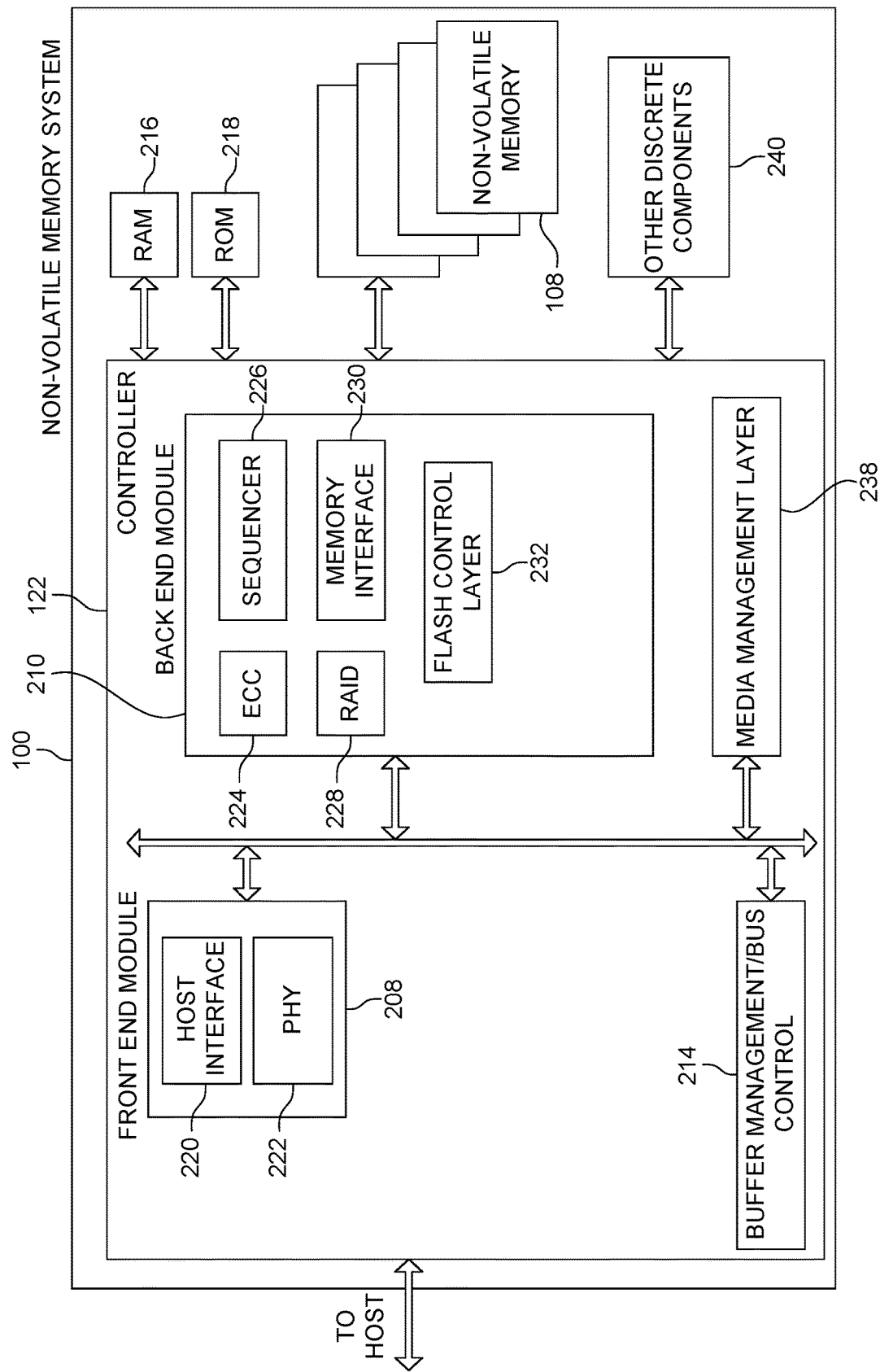
FIG. 2 is a block diagram of an example memory system, in connection with which, example embodiments of the disclosed technology can be implemented.

FIG. 2 is a block diagram of example memory system 100 that depicts more details of one embodiment of controller 122. While the controller 122 in the embodiment of FIG. 2 is a flash memory controller, it should be appreciated that non-volatile memory 108 is not limited to flash memory. Thus, the controller 122 is not limited to the particular example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In an example operation, when a host needs to read data from or write data to the flash memory, it will communicate with the flash memory controller. If the host provides a logical address to which data is to be read/written, the flash memory controller can convert the logical address received from the host to a physical address in the flash memory. Alternatively, the host itself can provide the physical address. The flash memory controller can also perform various memory management functions including, but not limited to, wear leveling (distributing writes to avoid wearing out specific blocks of memory that would otherwise be repeatedly written to) and garbage collection (after a block is full, moving only the valid pages of data to a new block, so that the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other examples, memory system 100 can be a solid state drive (SSD).

In some embodiments, non-volatile memory system 100 includes a single channel between controller 122 and non-volatile memory die 108. However, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if only a single channel is shown in the drawings.

As depicted in FIG. 2, controller 122 includes a front-end module 208 that interfaces with a host, a back-end module 210 that interfaces with the memory die 108, and various other modules that perform functions which will now be described in detail. The components of controller 122 depicted in FIG. 2 may take various forms including, without limitation, a packaged functional hardware unit (e.g., an electrical circuit) designed for use with other components, a portion of a program code (e.g., software or firmware) executable by a (micro) processor or processing circuitry that usually performs a particular function of related functions, a self-contained hardware or software component that interfaces with a larger system, or the like. For example, each module may include an ASIC, an FPGA, a circuit, a digital logic circuit, an analog circuit, a combination of discrete circuits, gates, or any other type of hardware or combination thereof. Alternatively or additionally, each module may include software stored in a processor readable device (e.g., memory) to program a processor to enable controller 122 to perform the functions described herein. The architecture depicted in FIG. 2 is one example implementation that may (or may not) use the components of controller 122 depicted in FIG. 1 (e.g., RAM, ROM, processor, interface).

Referring again to modules of the controller 122, a buffer manager/bus control 214 manages buffers in RAM 216 and controls the internal bus arbitration of controller 122. ROM 218 stores system boot code. Although illustrated in FIG. 2 as located separately from the controller 122, in other embodiments, one or both of RAM 216 and ROM 218 may be located within the controller. In yet other embodiments, portions of RAM 216 and ROM 218 may be located within the controller 122, while other portions may be located outside the controller. Further, in some implementations, the controller 122, RAM 216, and ROM 218 may be located on separate semiconductor dies.

Front-end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back-end module 210 includes an error correction code (ECC) engine 224 that encodes the data bytes received from the host, and decodes and error corrects the data bytes read from the non-volatile memory 108. A command sequencer 226 generates command sequences, such as program and erase command sequences, to be transmitted to non-volatile memory 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as one or more extra dies, or may be added within the existing die, e.g., as an extra plane, an extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back-end module 210.

Additional components of system 100 illustrated in FIG. 2 include media management layer (MML) 238, which performs wear leveling of memory cells of non-volatile memory die 108, as well as, other discrete components 240, such as external electrical interfaces, external RAM, resistors, capacitors, or other components that may interface with controller 122. In alternative embodiments, one or more of the physical layer interface 222, RAID module 228, MML 238, or buffer management/bus controller 214 are optional components.

MML 238 (e.g., Flash Translation Layer (FTL)) may be integrated as part of the flash management for handling flash errors and interfacing with the host. In particular, MML 238 may be a module in flash management and may be responsible for the internals of NAND management. In particular, MML 238 may include an algorithm in the memory device firmware which translates writes from the host into writes to the memory 126 of die 108. MML 238 may be needed because: 1) the memory 126 may have limited endurance; 2) the memory 126 may only be written in multiples of pages; and/or 3) the memory 126 may not be written unless it is erased as a block (or a tier within a block in some embodiments). MML 238 understands these potential limitations of the memory 126 which may not be visible to the host. Accordingly, MML 238 attempts to translate the writes from host into writes into the memory 126.

Controller 122 may interface with one or more memory dies 108. In one embodiment, controller 122 and multiple memory dies (together comprising non-volatile storage system 100) implement an SSD, which can emulate, replace, or be used in place of a hard disk drive inside a host, as a network access storage (NAS) device, in a laptop, in a tablet, in a server, etc. Additionally, the SSD need not be made to work as a hard drive.

Some embodiments of the non-volatile storage system 100 may include one memory die 108 connected to one controller 122. Other embodiments may include multiple memory dies 108 in communication with one or more controllers 122. In one example, the multiple memory dies 108 can be grouped into a set of memory packages. Each memory package may include one or more memory dies 108 in communication with controller 122. In one embodiment, a memory package includes a printed circuit board (or similar structure) with one or more memory dies 108 mounted thereon. In some embodiments, a memory package can include molding material to encase the memory dies 108 of the memory package. In some embodiments, controller 122 is physically separate from any of the memory packages.

Figure 3:
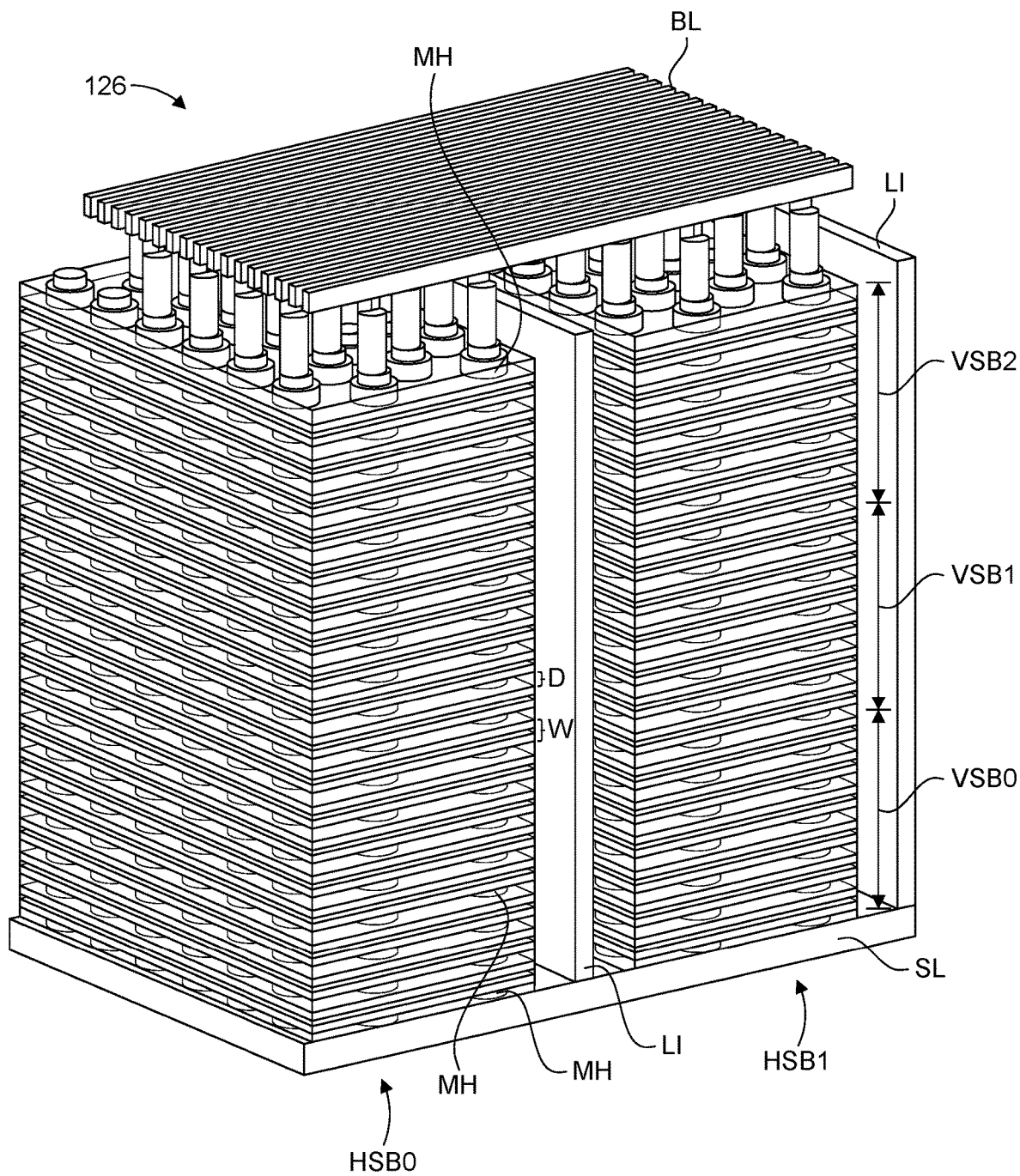
FIG. 3 is a perspective view of a portion of an example monolithic three-dimensional memory structure, in connection with which, example embodiments of the disclosed technology can be implemented.

FIG. 3 is a perspective view of a portion of a monolithic 3D memory array that includes a plurality of non-volatile memory cells, and that can comprise memory structure 126 in one embodiment. FIG. 3 illustrates, for example, a portion of one block of memory. The structure depicted includes a set of bitlines (BLs) positioned above a stack of alternating dielectric layers and conductive layers. For example purposes, one of the dielectric layers is marked as D and one of the conductive layers (also called wordline layers) is marked as W. The number of alternating dielectric and conductive layers can vary based on specific implementation requirements. In some embodiments, the 3D memory array includes between 108-300 alternating dielectric and conductive layers. One example embodiment includes 96 data wordline layers, 8 select layers, 6 dummy wordline layers, and 110 dielectric layers. More or less than 108-300 layers can also be used. Data wordline layers include data memory cells. Dummy wordline layers include dummy memory cells. As will be explained below, the alternating dielectric and conductive layers are divided into four "fingers" by local interconnects LI. FIG. 3 shows two fingers and two local interconnects LI. Below the alternating dielectric layers and wordline layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the 3D monolithic memory array that may comprise memory structure 126 is provided below with respect to FIGS. 4A-4H.

One of the local interconnects LI separates the block into two horizontal sub-blocks HSB0, HSB1. The block comprises multiple vertical sub-blocks VSB0, VSB1, VSB2. The vertical sub-blocks VSB0, VSB1, VSB2 can also be referred to as "tiers." Each vertical sub-block extends across the block, in one embodiment. Each horizontal sub-block HSB0, HSB1 in the block is a part of vertical sub-block VSB0. Likewise, each horizontal sub-block HSB0, HSB1 in the block is a part of vertical sub-block VSB1. Likewise, each horizontal sub-block HSB0, HSB1 in the block is a part of vertical sub-block VSB2. For ease of explanation, vertical sub-block VSB0 will be referred to as a lower vertical sub-block, vertical sub-block VSB1 will be referred to as a middle vertical sub-block, and VSB2 will be referred to as an upper vertical sub-block. In one embodiment, there are two vertical sub-blocks in a block. In other embodiments, there could be four or more vertical sub-blocks in a block.

A memory operation for a vertical sub-block may be performed on memory cells in one or more horizontal sub-blocks. For example, a programming operation of memory cells in vertical sub-block VSB0 may include: programming memory cells in horizontal sub-block HSB0 but not horizontal sub-block HSB1; programming memory cells in horizontal sub-block HSB1 but not horizontal sub-block HSB0; or programming memory cells in both horizontal sub-block HSB0 and horizontal sub-block HSB1.

The different vertical sub-blocks VSB0, VSB1, VSB2 are treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block VSB1 are programmed while there is valid data in the lower vertical sub-block VSB0 and/or the upper vertical sub-block VSB2. Programming the memory cells in middle vertical sub-block VSB1 may present challenges due to the valid data in the other vertical sub-blocks VSB0, VSB2.

Figure 4A:
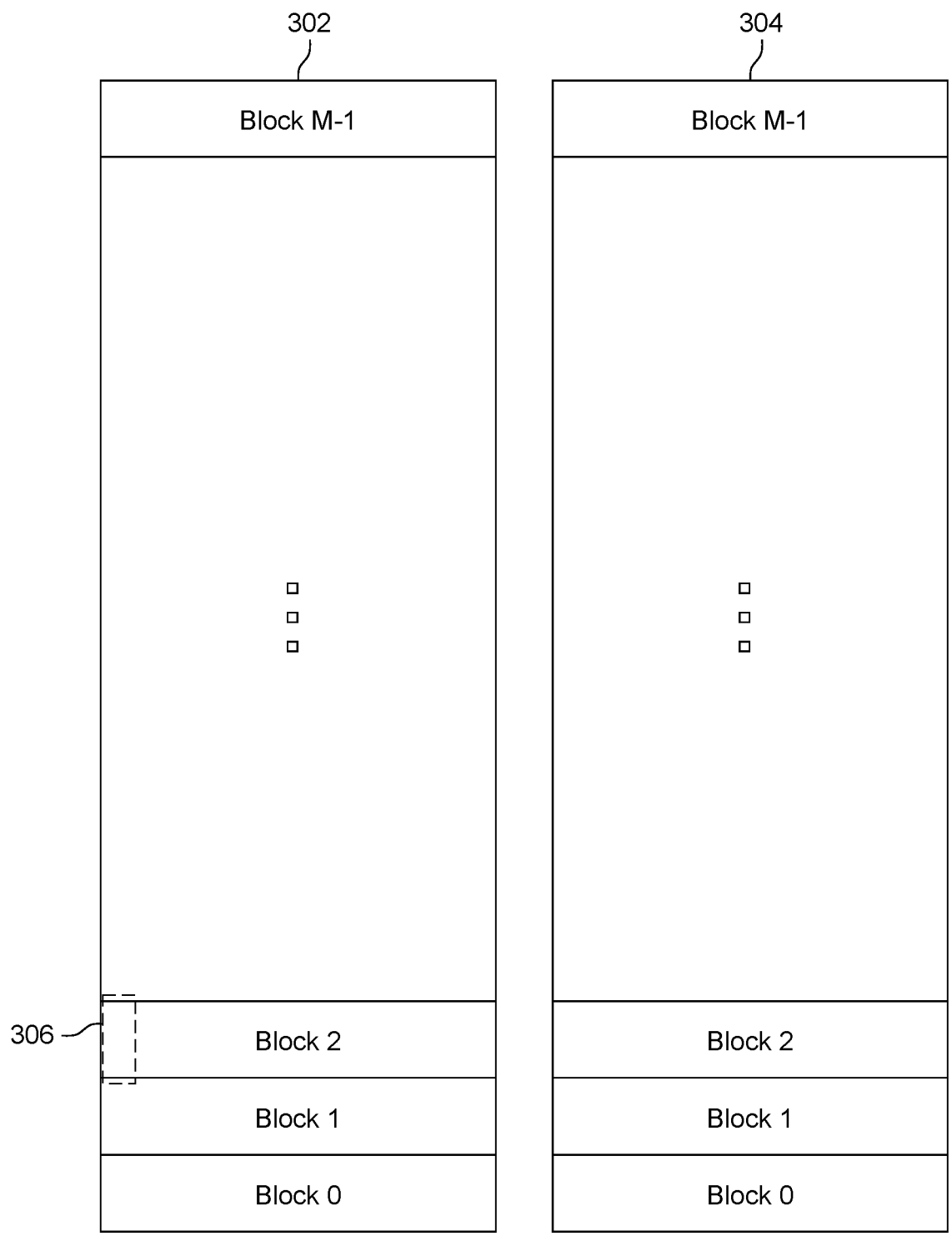
FIG. 4A is a block diagram of an example memory structure having two planes, in connection with which, example embodiments of the disclosed technology can be implemented.

FIG. 4A is a block diagram depicting one example organization of memory structure 126, which is divided into two planes 302 and 304. Each plane is then divided into M blocks. In one example, each plane has about 2000 blocks. However, different numbers of blocks and planes can also be used. In one embodiment, a block of memory cells constitutes a single unit for an erase operation. That is, in one embodiment, all memory cells of a block are erased together. In other embodiments, memory cells can be grouped into blocks for other reasons, such as to organize the memory structure 126 to enable the signaling and selection circuits. In some embodiments, a block represents a groups of connected memory cells that share a common set of wordlines.

Figure 4B:
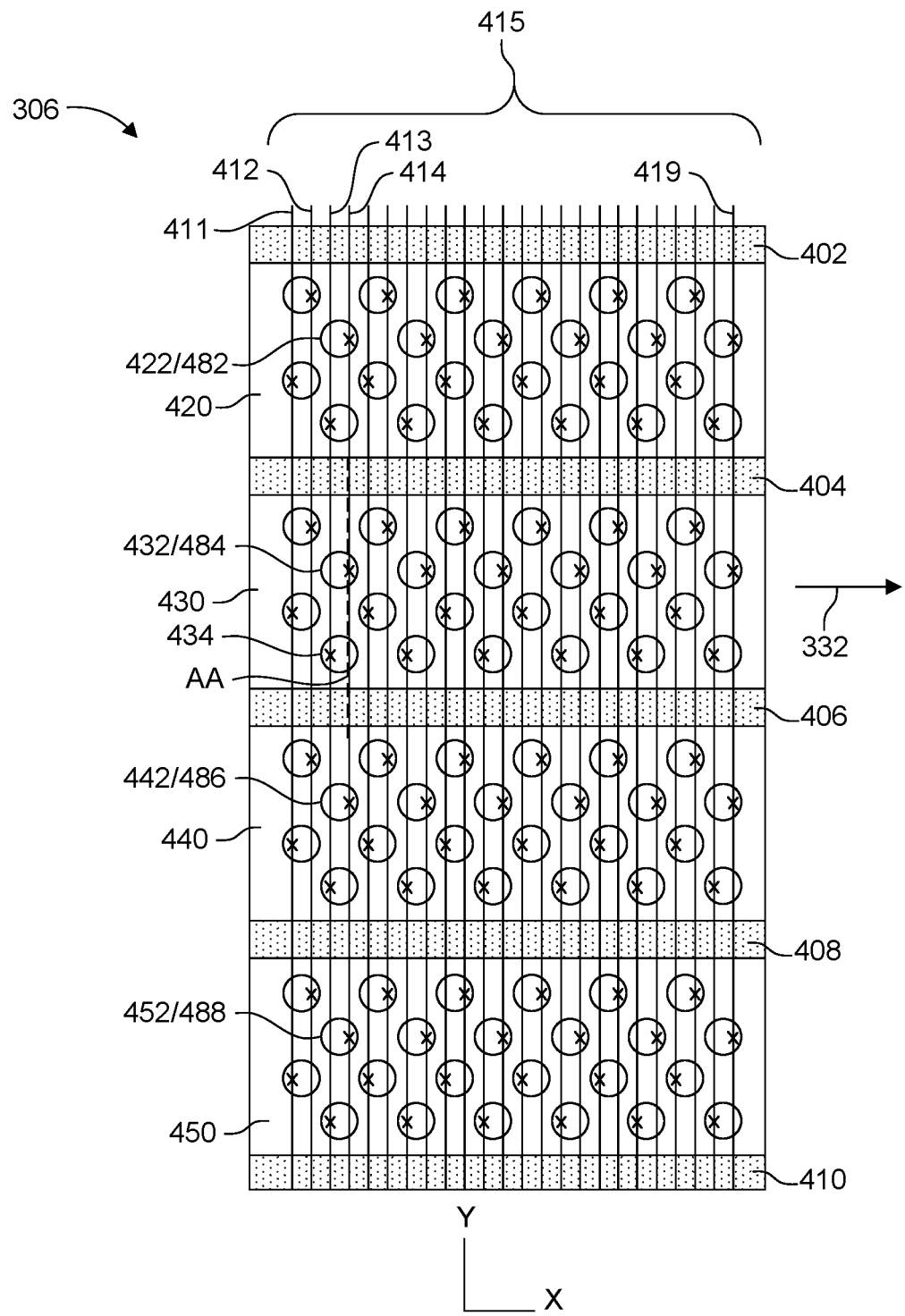
FIG. 4B depicts a top view of a portion of a block of example memory cells, in connection with which, example embodiments of the disclosed technology can be implemented.

FIGS. 4B-4F depict an example 3D NAND structure that corresponds to the structure of FIG. 3 and that can be used to implement memory structure 126 of FIG. 2. Although the example memory system of FIGS. 3-4H is a 3D memory structure that includes vertical NAND strings with charge-trapping material, it should be appreciated that other (2D and 3D) memory structures can also be used with the technology described herein. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. While in some embodiments, the memory array may have many layers, FIG. 4B illustrates only the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bitlines 415, including bitlines 411, 412, 413, 414, . . . 419. FIG. 4B shows twenty-four bitlines because only a portion of the block is depicted. It is contemplated that more than twenty-four bitlines connected to vertical columns of the block. Each of the circles representing vertical columns has an "x" to indicate its connection to one bitline. For example, bitline 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as wordline fingers that are separated by the local interconnects. In one embodiment, the wordline fingers on a common level of a block connect together to form a single wordline. In another embodiment, the wordline fingers on the same level are not connected together. In one example implementation, a bitline only connects to one vertical column in each of regions 420, 430, 440 and 450. In that implementation, each block has sixteen rows of active columns and each bitline connects to four rows in each block. In one embodiment, all of the four rows connected to a common bitline are connected to the same wordline (via different wordline fingers on the same level that are connected together), in which case, the system uses the source side selection lines and the drain side selection lines to choose one (or another subset) of the four to be subjected to a memory operation (program, verify, read, and/or erase).

Although FIG. 4B shows four regions and sixteen rows of vertical columns in a block, with each region having four rows of vertical columns, those exact numbers are an example implementation. Other embodiments may include more or less regions per block, more or less rows of vertical columns per region, and/or more or less rows of vertical columns per block. FIG. 4B also shows the vertical columns being staggered. In other embodiments, different patterns of staggering can be used. In some embodiments, the vertical columns may not be staggered.

Figure 4C:
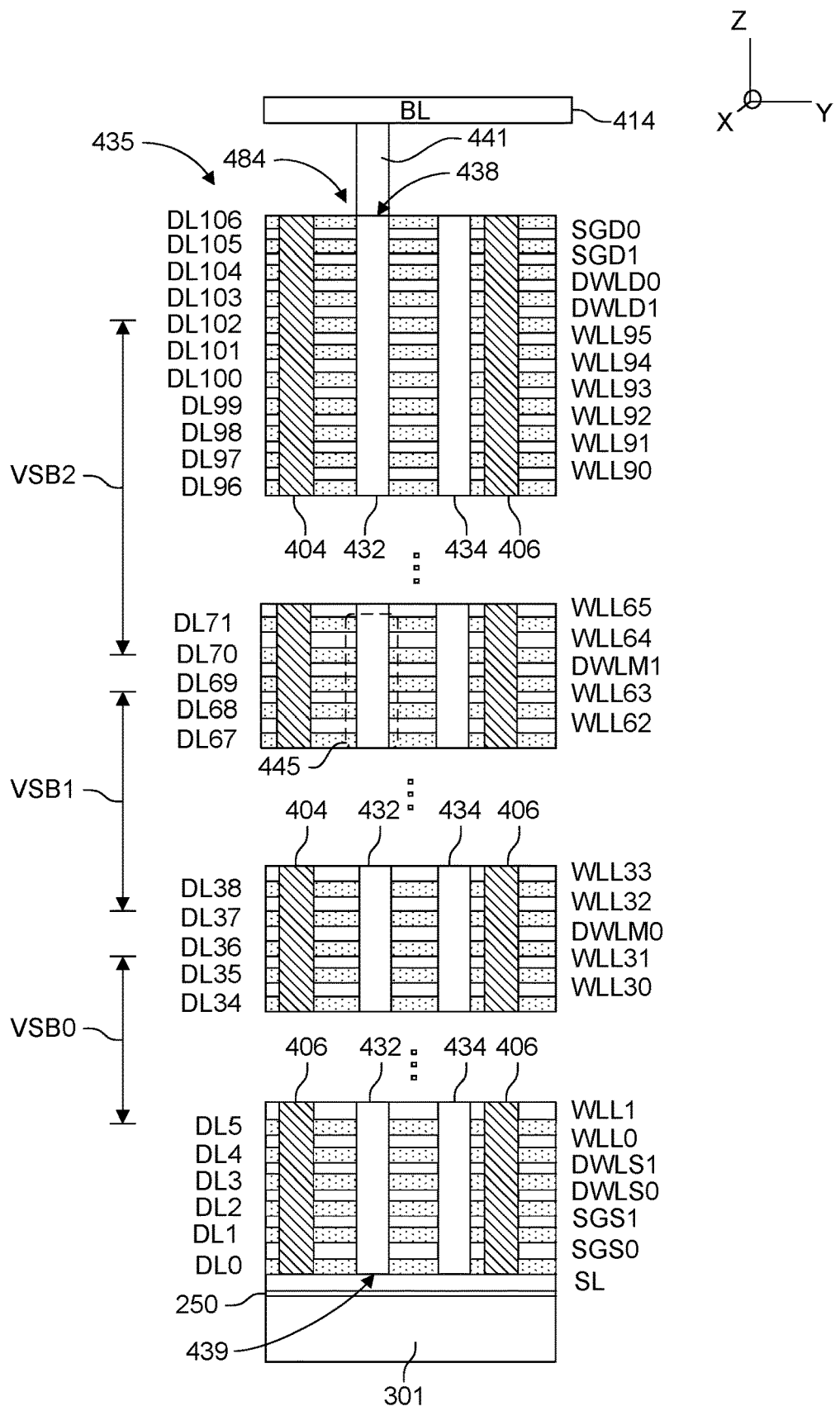
FIG. 4C depicts a stack showing a cross-sectional view along line AA of FIG. 4B.

FIG. 4C depicts an embodiment of a stack 435 showing a cross-sectional view along line AA of FIG. 4B. Two SGD layers (SGD0, SDG1), two SGS layers (SGS0, SGS1) and six dummy wordline layers DWLD0, DWLD1, DWLM1, DWLM0, DWLS0 and DWLS1 are provided, in addition to the data wordline layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 301, an insulating film 250 on the substrate, and a portion of a source line SL. A portion of the bitline 414 is also depicted. Note that NAND string 484 is connected to the bitline 414.

NAND string 484 has a source-end 439 at a bottom of the stack and a drain-end 438 at a top of the stack. The source-end 439 is connected to the source line SL. A conductive via 441 connects the drain-end 438 of NAND string 484 to the bitline 414. The metal-filled slits 404 and 406 from FIG. 4B are also depicted.

The stack 435 is divided into three vertical sub-blocks (VSB0, VSB1, VSB2). Vertical sub-block VSB0 includes WLL0-WLL31. Layers SGS0, SGS1, DWLS0, DWLS1 could also be considered to be a part of vertical sub-block VSB0. Vertical sub-block VSB1 includes WLL32-WLL63. Layers SGD0, SGD1, DWLD0, DWLD1 could also be considered to be a part of vertical sub-block VSB2. Vertical sub-block VSB2 includes WLL64-WLL95. Each NAND string has a set of data memory cells in each of the vertical sub-blocks. Dummy wordline layer DMLM0 is between vertical sub-block VSB0 and vertical sub-block VSB1. Dummy wordline layer DMLM1 is between vertical sub-block VSB1 and vertical sub-block VSB2. The dummy wordline layers have dummy memory cell transistors that may be used to electrically isolate a first set of memory cell transistors within the memory string (e.g., corresponding to vertical sub-block VSB0 wordlines WLL0-WLL31) from a second set of memory cell transistors within the memory string (e.g., corresponding to the vertical sub-block VSB1 wordlines WLL32-WLL63) during a memory operation (e.g., an erase operation or a programming operation).

In another embodiment, one or more middle junction transistor layers are used to divide the stack 435 into vertical sub-blocks. A middle junction transistor layer contains junction transistors, which do not necessarily contain a charge storage region. Hence, a junction transistor is typically not considered to be a dummy memory cell. Both a junction transistor and a dummy memory cell may be referred to herein as a "non-data transistor." A non-data transistor, as the term is used herein, is a transistor on a NAND string, where the transistor is either configured to not store user or system data or operated in such a way that the transistor is not used to store user data or system data. A wordline that is connected to non-data transistors is referred to herein as a non-data wordline. Examples of non-data wordlines include, but are not limited to, dummy wordlines, a select line in a middle junction transistor layer, or the like.

The stack 435 may have more than three vertical sub-blocks. For example, the stack 435 may be divided into four, five, or more vertical sub-blocks. Each of the vertical sub-blocks may contain at least one data memory cell. In some embodiments, additional layers similar to the middle dummy wordline layers DWLM may be provided to divide the stack 435 into the additional vertical sub-blocks. In one embodiment, the stack has two vertical sub-blocks.

Figure 4D:
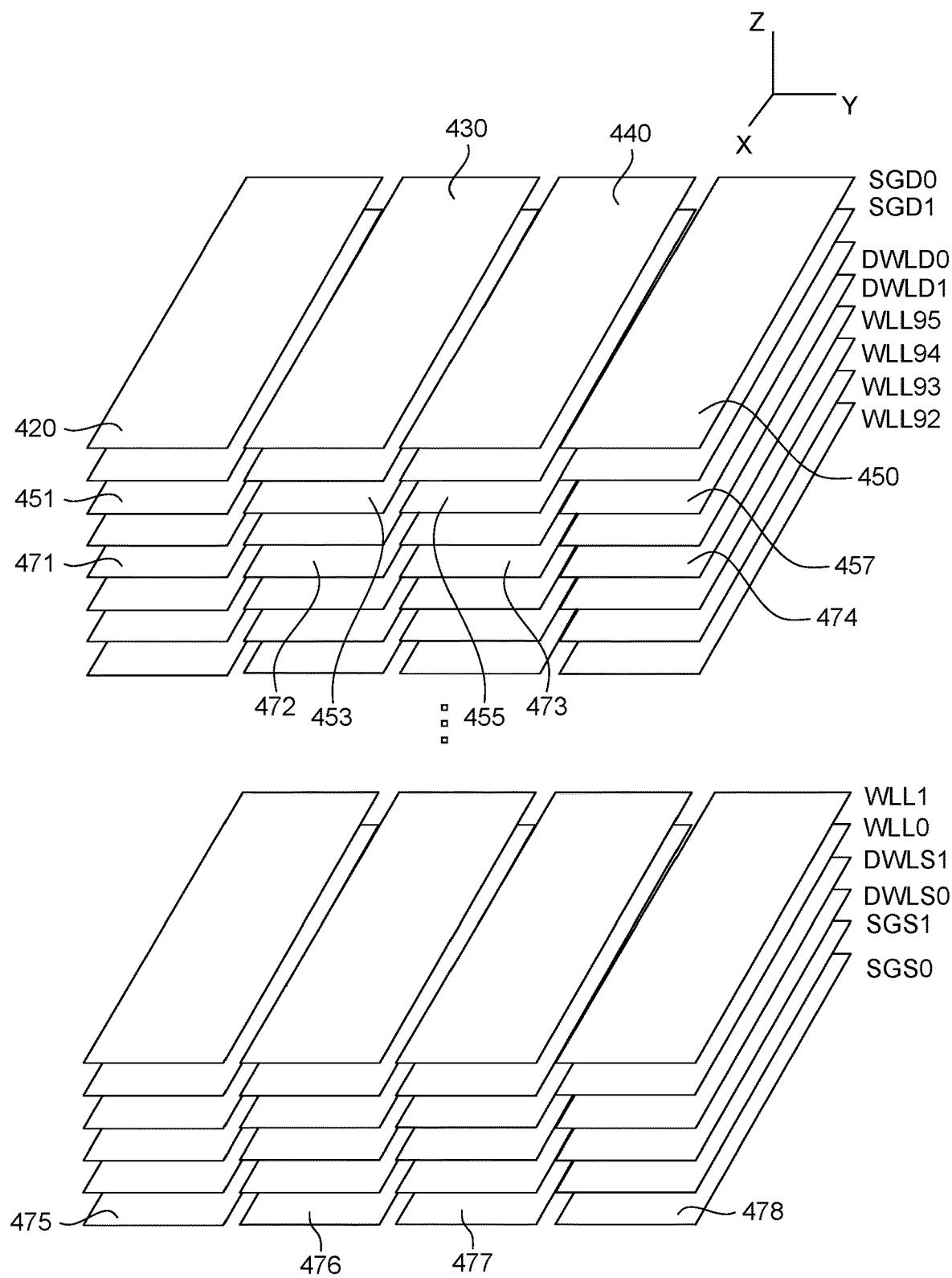
FIG. 4D depicts an alternative view of the select gate layers and wordline layers of the stack 435 of FIG. 4C.

FIG. 4D depicts an alternative view of the SG layers and wordline layers of the stack 435 of FIG. 4C. Each of SGD layers SGD0 and SGD0 (the drain side SG layers) includes parallel rows of SG lines associated with the drain side of a set of NAND strings. For example, SGD0 includes drain side SG regions 420, 430, 440 and 450, consistent with FIG. 4B. Below the SGD layers are the drain side dummy wordline layers. In one implementation, each dummy wordline layer represents a wordline that is connected to a set of dummy memory cells at a given height in the stack. For example, DWLD0 includes wordline layer regions 451, 453, 455 and 457. A dummy memory cell, also referred to herein as a non-data memory cell, does not store data and is ineligible to store data, while a data memory cell is eligible to store data. Moreover, the threshold voltage Vth of a dummy memory cell is generally fixed at the time of manufacture or may be periodically adjusted, while the Vth of the data memory cells changes more frequently, e.g., during erase and programming operations of the data memory cells.

Below the dummy wordline layers are the data wordline layers. For example, WLL95 comprises wordline layer regions 471, 472, 473 and 474. Below the data wordline layers are the source side dummy wordline layers. Below the source side dummy wordline layers are the SGS layers. Each of the SGS layers SGS0 and SGS1 (the source side SG layers) includes parallel rows of SG lines associated with the source side of a set of NAND strings. For example, SGS0 includes source side SG lines 475, 476, 477 and 478. In some embodiments, each SG line is independently controlled, while in other embodiments, the SG lines are connected and commonly controlled.

Figure 4E:
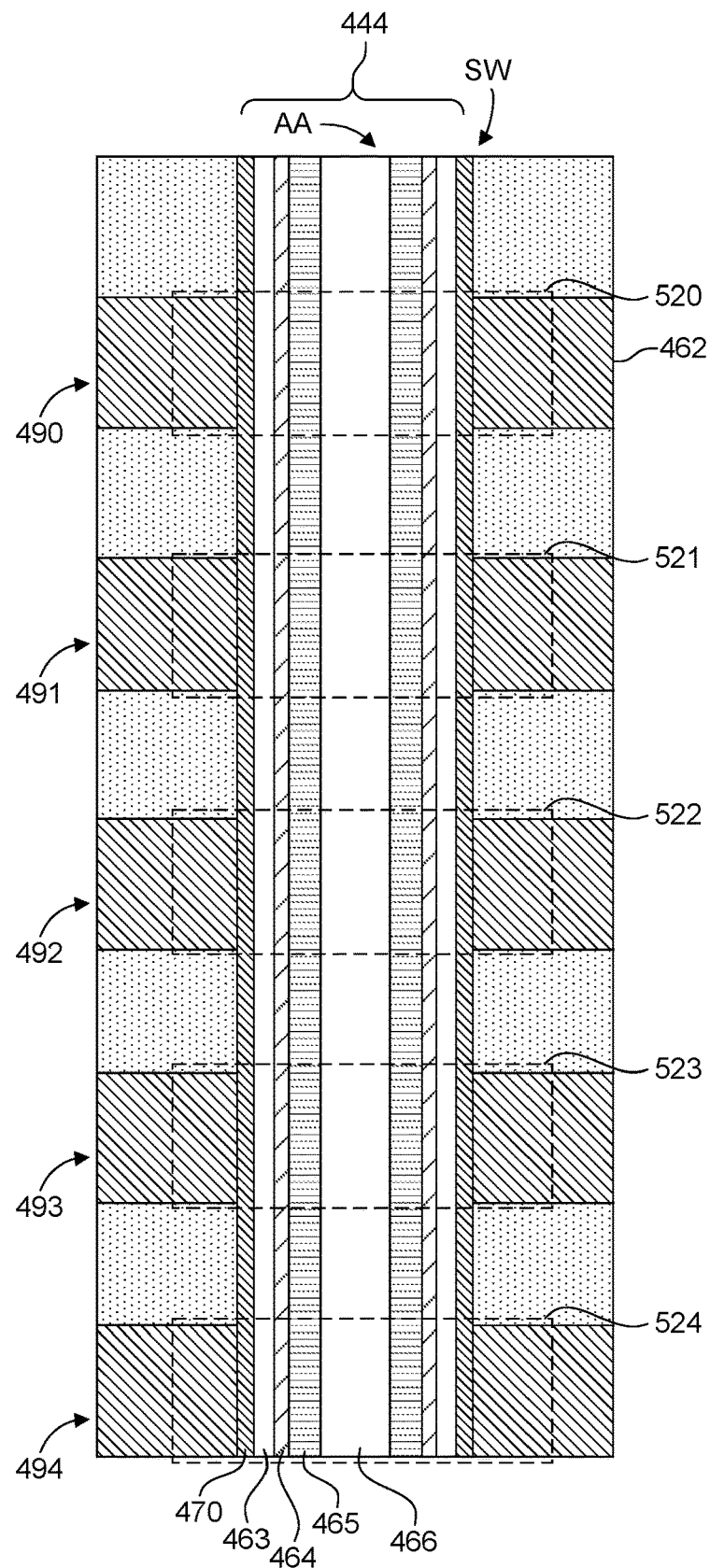
FIG. 4E depicts a view of the region 445 of FIG. 4C.

FIG. 4E depicts a view of the region 445 of FIG. 4C. Data memory cell transistors 520 and 521 are above dummy memory cell transistor 522. Below dummy memory cell transistor 522 are data memory cell transistors 523 and 524. A number of layers can be deposited along the sidewall (SW) of the memory hole 444 and/or within each wordline layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A wordline layer can include a conductive metal 462 such as tungsten as a control gate. For example, control gates 490, 491, 492, 493 and 494 are provided. In this example, all of the layers except the metal are provided in the memory hole. In other approaches, some of the layers may be in the control gate layer. Additional pillars can be similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Non-data transistors (e.g., select transistors, dummy memory cell transistors) may also include the charge trapping layer 463. For example, in FIG. 4E, dummy memory cell transistor 522 includes the charge trapping layer 463. Thus, the Vth of at least some non-data transistors may also be adjusted by storing or removing electrons from the charge trapping layer 463. However, it is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer, and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4F:
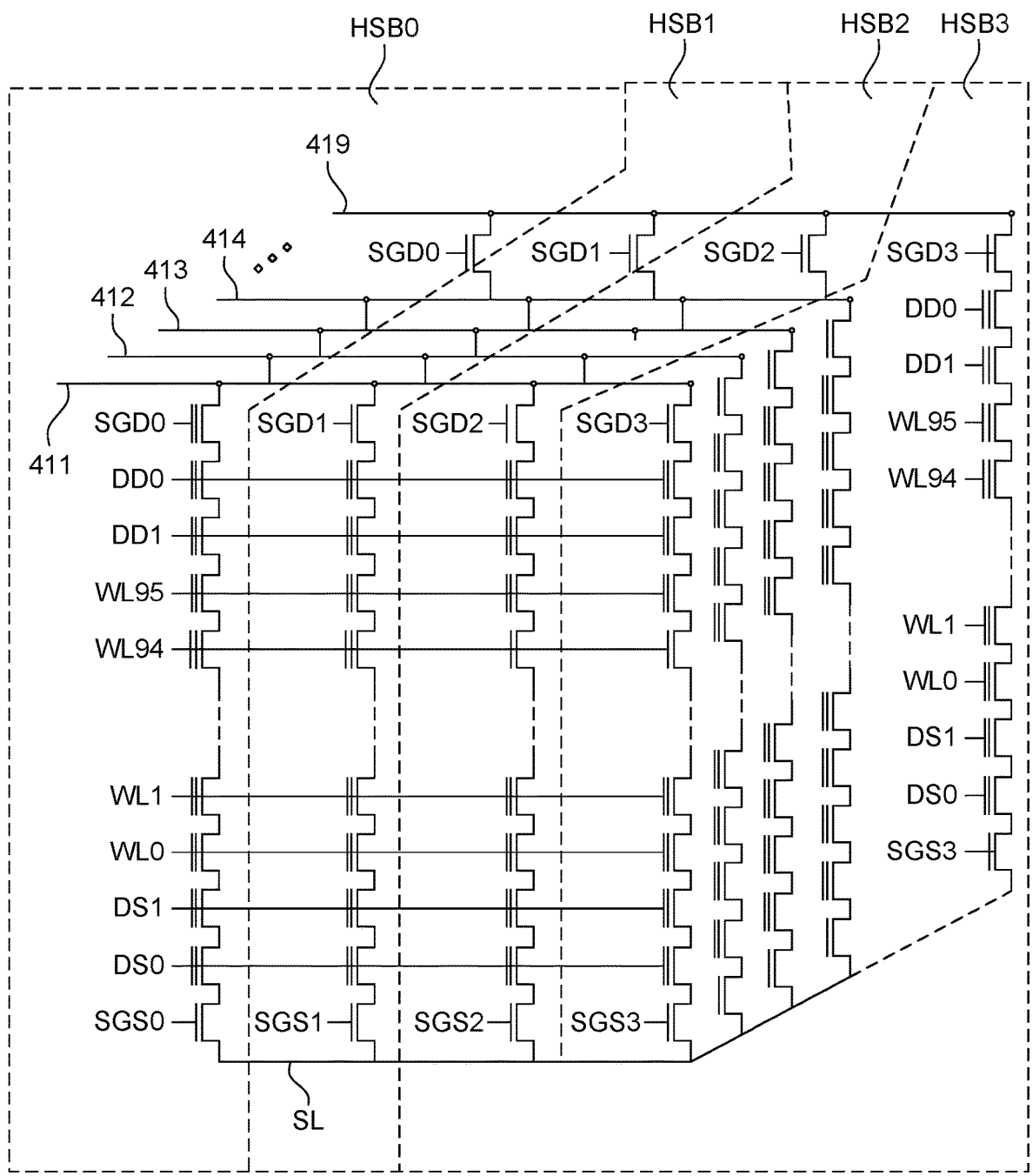
FIG. 4F is a schematic of a plurality of example NAND strings showing multiple horizontal sub-blocks, in connection with which, example embodiments of the disclosed technology can be implemented.

FIG. 4F is a schematic diagram of a portion of the memory depicted in FIGS. 3-4E. FIG. 4F shows physical wordlines WLL0-WLL95 running across the entire block. The structure of FIG. 4F corresponds to portion 306 in Block 2 of FIGS. 4A-E, including bitlines 411, 412, 413, 414, . . .

419. Within the block, each bitline is connected to four NAND strings. Drain side selection lines SGD0, SGD1, SGD2 and SGD3 are used to determine which of the four NAND strings connect to the associated bitline(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, horizontal sub-block HSB1 corresponds to those vertical NAND strings controlled by SGD1 and SGS1, horizontal sub-block HSB2 corresponds to those vertical NAND strings controlled by SGD2 and SGS2, and horizontal sub-block HSB3 corresponds to those vertical NAND strings controlled by SGD3 and SGS3.

Figure 4G:
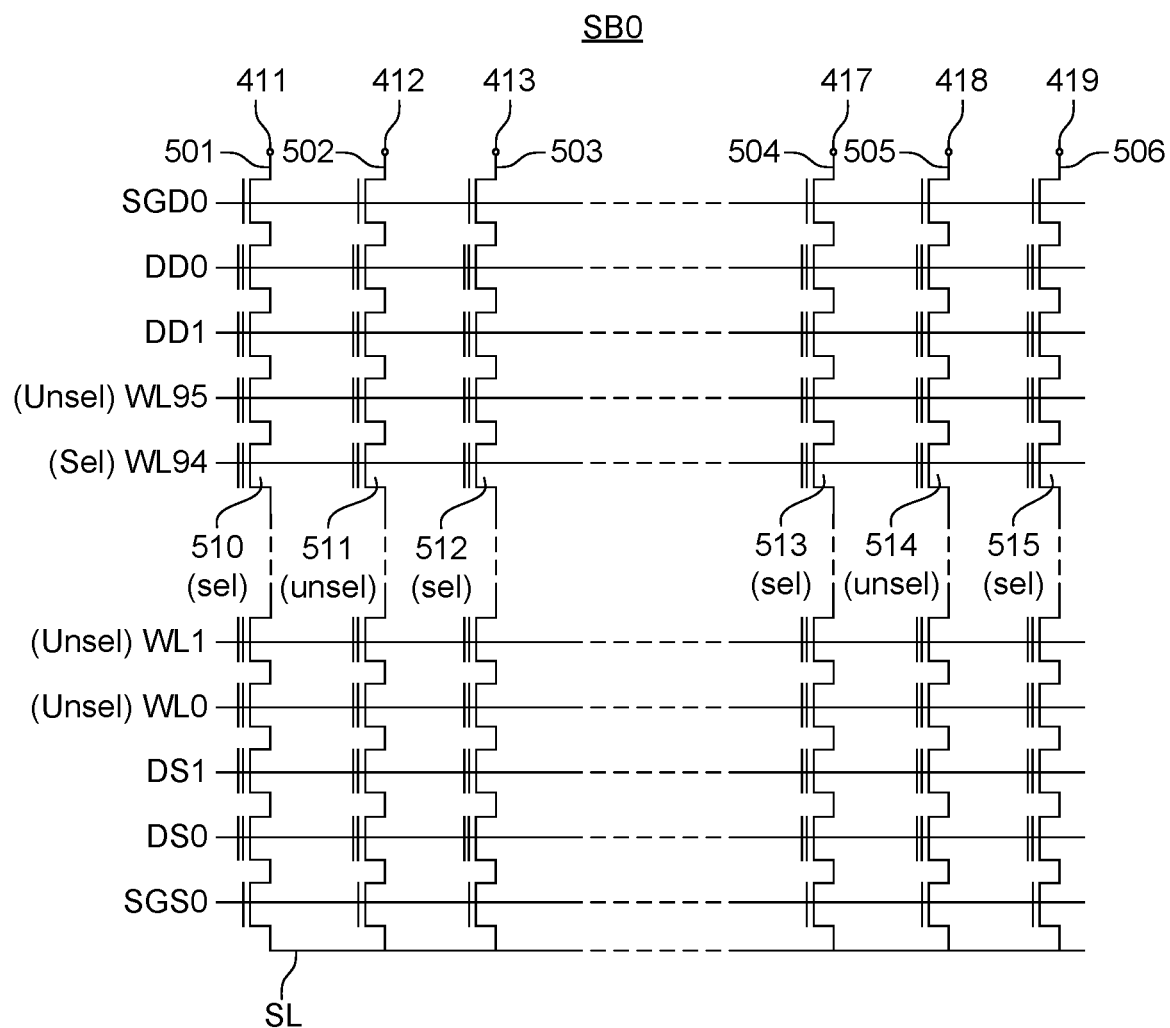
FIG. 4G is a schematic of a plurality of NAND strings showing one example horizontal sub-block, in connection with which, example embodiments of the disclosed technology can be implemented.

FIG. 4G is a schematic of horizontal sub-block HSB0. Horizontal sub-blocks HSB1, HSB2 and HSB3 may have similar structures. FIG. 4G shows physical wordlines WL0-WL95 running across the entire sub-block HSB0. All of the NAND strings of sub-block HSB0 are connected to SGD0 and SGS0. For ease of depiction, FIG. 4G only depicts six NAND strings 501, 502, 503, 504, 505, and 506; however, horizontal sub-block HSB0 may have thousands of NAND strings (e.g., 15,000 or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells, while the memory cells that are not intended to take on a new electrical characteristic (or other characteristic) to reflect a changed programming state are referred to as the unselected memory cells. In certain situations, unselected memory cells may be connected to the same wordline as selected memory cells. Unselected memory cells may also be connected to different wordlines than selected memory cells. Similarly, during a reading process, the set of memory cells to be read are referred to as the selected memory cells, while the memory cells that are not intended to be read are referred to as the unselected memory cells.

To better understand the concept of selected memory cells and unselected memory cells, assume a programming operation is to be performed and, for example purposes only, that wordline WL94 and horizontal sub-block HSB0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HSB0 are selected memory cells and some of the memory cells connected to WL94 in horizontal sub-block HSB0 are unselected memory cells depending on how the programming operation is performed and the data pattern being programmed. For example, those memory cells that are to remain in the erased state (e.g., state S0) will be unselected memory cells because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 511 and 514 (which are connected to wordline WL94) are to remain in the erased state; therefore, memory cells 511 and 514 are unselected memory cells (labeled unset in FIG. 4G). Additionally, assume, for example purposes, that memory cells 510, 512, 513 and 515 (which are connected to wordline WL94) are each to be programmed to a respective one of data states S1-S7; therefore, memory cells 510, 512, 513 and 515 are selected memory cells (labeled sel in FIG. 4G).

Figure 5:
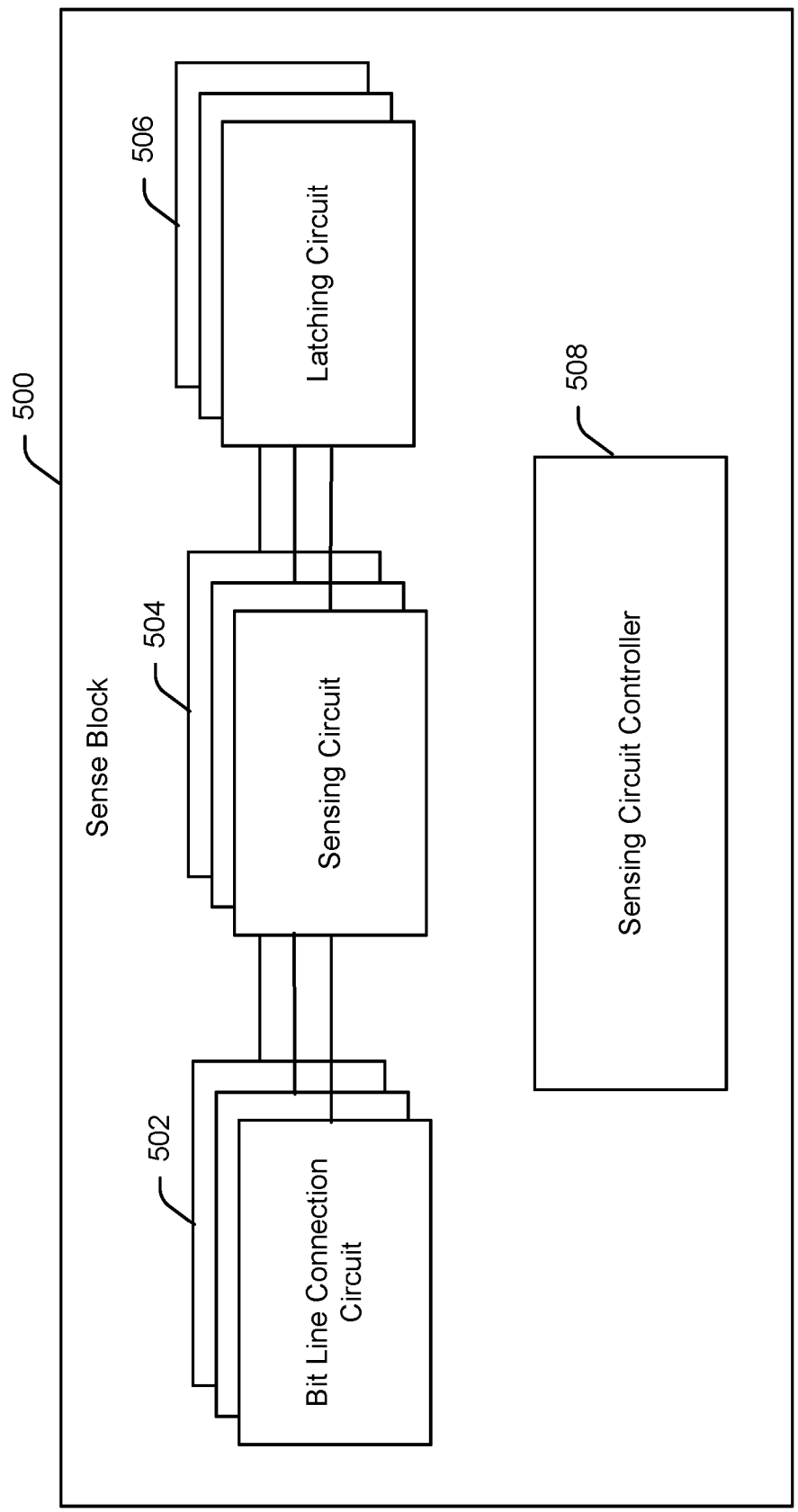
FIG. 5 is a schematic block diagram depicting an example configuration of a sense block of a memory die, in connection with which, example embodiments of the disclosed technology can be implemented.

FIG. 5 is a block diagram of an example configuration of a sense block 500, which may be representative of one of the sense blocks 150 (FIG. 1). The sense block 500 may include a plurality of sense circuits 504 and a plurality of sets of latching circuits 506. For example, there can be 16 k sets of sense circuits 504 and latching circuits 506. In other example embodiments, there can be a set of sense circuits 504 and a respective latching circuit 506 for each memory cell in a memory array, for example. In some embodiments, each sense circuit 504 (which may also include sense amplifier circuitry) may be associated with a respective one of the latching circuits 506. That is, each sense circuit 504 may be configured to communicate with and/or perform a sense operation using data and/or storing data into its associated latching circuit 506.

Additionally, the sense block 500 may include a sense circuit controller 508 that is configured to control operation of the sense circuits 504 (and/or the sets of latches 506) of the sense block 500. As described in further detail below, the sense circuit controller 508 may control operation of the sense circuits 504 and the latches 506 by outputting control signals to terminals of the sense circuits 504 and the latches 506. The sense circuit controller 508 may be implemented in hardware, firmware, software, or combinations thereof. For example, the sense circuit controller 508 may include a processor that executes computer instructions stored in a memory to perform at least some of its functions. Controller 508 can be configured with various modules to perform one or more functions. Each module may include one or more instructions for execution of logic of one or more circuits described herein. For example, instructions may include instructions for generating one or more signals or sensing one or more voltage levels. Instructions may further include instructions for executing any of the steps of any of the methods disclosed herein. The controller 508 may send messages and receive data, including program code, through one or more communication interface(s). The received code may be executed by a processor of the controller 508 as it is received, and/or stored in a storage device, or other non-volatile storage for later execution.

Sense circuits 504 described herein can be coupled to bitlines and/or wordlines. Bitline connection circuit 502 is depicted in FIG. 5 as part of sense block 500. It should be appreciated, however, that the bitline connection circuit 502 may be, more generally, part of read/write circuit 128. Bitline connection circuit 502 may be configured to electrically connect and disconnect the ith bitline BL(i) from the sensing circuit 504 (and the latching circuit 506). In the case of a 3D NAND architecture, the ith bitline BL(i) may be connected to a respective memory hole from each NAND string of each NAND block of the 3D structure. In the case of a 2D NAND architecture, the ith bitline BL(i) may be connected to an associated NAND string. The ith bitline BL(i) may be one of a plurality bitlines and the NAND string may be one of a plurality of NAND strings included in a memory cell structure of a memory die. The NAND string can include one or more memory cells. For a read operation, a target memory cell can be a memory cell from which data is to be read, and thus, for which a sense operation is performed. For a verification operation, a target memory cell can be a memory cell being programmed in an associated program-verify operation.

When the bitline connection circuitry 502 connects the ith bitline BL(i) to the sensing circuit 504 (e.g. for a sense operation), current may flow from the sense circuit 504 to the ith bitline BL(i). Alternatively, when the bitline connection circuitry 502 disconnects the ith bitline BL(i) from the sense circuit 504, current may be prevented from flowing from the sensing circuit 504 to the ith bitline BL(i). Bitline connection circuit 502 may include a bitline biasing circuit configured to bias the ith bitline BL(i) by generating a bitline bias voltage at a bitline bias node. The amount of the bitline bias voltage may depend on whether the ith bitline BL(i) is a selected bitline or an unselected bitline. In particular, when the ith bitline BL(i) is a selected bitline, the bitline biasing may allow the bitline bias voltage at the high supply voltage level or a level corresponding to the high supply voltage, and when the ith bitline BL(i) is an unselected bitline, the bitline biasing circuit may generate the bitline bias voltage at the cell source voltage level or a level corresponding to the cell source voltage.

Sensing circuits 504 described herein can include a pre-charge circuit path configured to pre-charge one or more sense node(s) with a voltage at a pre-charge level during a sense operation. A latching circuit 506, in response to receiving a control signal at a high voltage level at a first transistor of the latch circuit 506, can enable a pre-charge circuit path to pre-charge the sense node with the voltage at the pre-charge level.

Figure 6A:
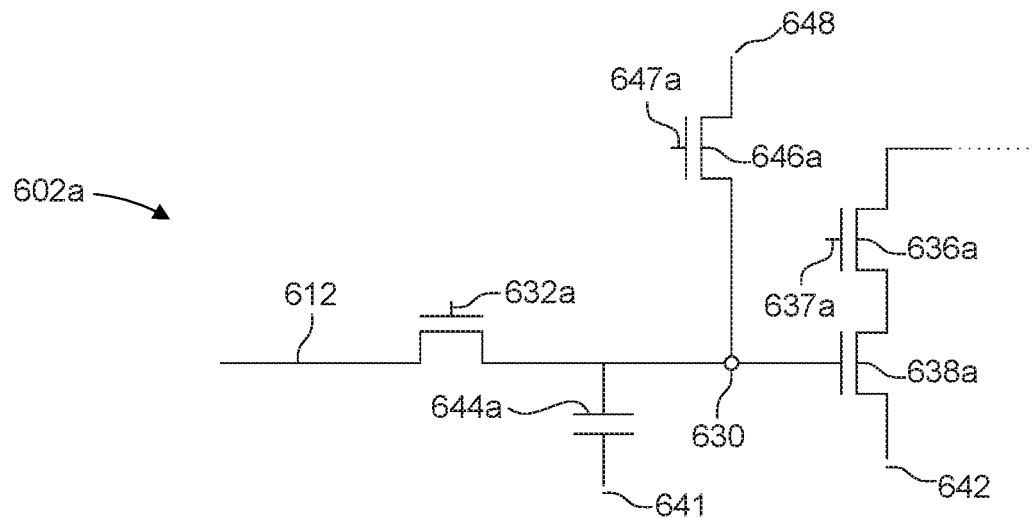
FIG. 6A shows a prior configuration of a sensing circuit.
Figure 6B:
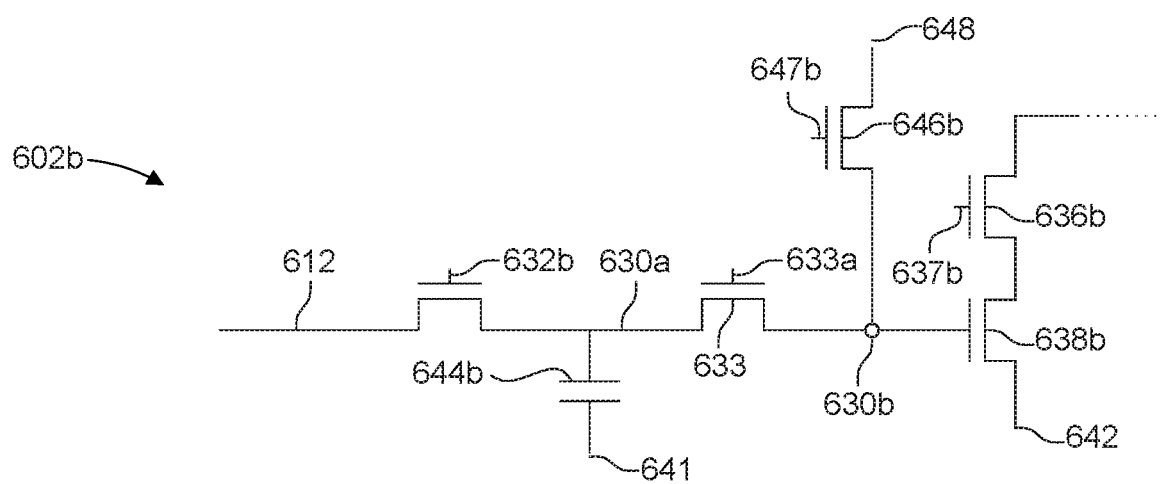
FIG. 6B shows a configuration of a digitized sensing circuit with increased sense margin in accordance with various embodiments of the disclosed technology.

FIG. 6A shows an existing configuration of a sensing circuit 602a (which can be an example sensing circuit 504 of FIG. 5). FIG. 6B shows a configuration of a sensing circuit 602b with improved sense margin, as disclosed herein. Sensing circuit 602b can "digitize" the sensed voltage level corresponding to the ON/OFF status of a memory cell. More specifically, the sensing circuit 602b can allow for a "digital" sensing scheme in which sensed voltage values corresponding to highly conducting memory cells correspond to a sensed ON state, and differ (e.g. substantially differ) from the sensed voltage values corresponding to a sensed OFF state of non-conducting memory cells.

Sensing circuits 602a and 602b may be coupled, at node 612, between one or more bitline connection circuits (e.g., bitline connection circuit 502 of FIG. 5) and one or more data latches (e.g., latching circuit 506 of FIG. 5). For example, the node 612 may represent a coupling between NAND strings of the memory structure 126 and the other circuit elements of the sensing circuit 504. In example embodiments, the configuration of sensing circuit 602b may differ from the configuration of sensing circuit 602a in that a sense node 630 of sensing circuit 602a may be split, by a transistor 633, into two sense nodes, nodes 630a and 630b, in the configuration of sensing circuit 602b. In some embodiments of the disclosed technology, when the node 630a starts to discharge, the transistor 633 can be turned on by application of a control signal 633a thereto, which can be generated by the sensing circuit controller 508 or another peripheral circuit. A sense enable transistor 632a of sensing circuit 602a and a sense enable transistor 632b of sensing circuit 602b are also shown in FIGS. 6A and 6B, respectively. In some embodiments, the sense time may correspond to or may otherwise be based on an on time of the sense enable transistor 632a (or an on time of the sense enable transistor 632b, as the case may be).

In an example scenario, when the sensing circuit controller 508 enables the sense enable transistor 632a, current may flow from a cell connected via a bit line connection circuit 502 to the ith bit line BL(i) through the sense circuit 602a, and may discharge the sense node 630. Similarly, as described in further detail below with respect to the timing diagram of FIG. 9, current may flow from the cell connected via a bit line connection circuit 502 to the ith bit line BL(i) through the sense circuit 602b and discharge the sense node 630a. The node 630 (and the node 630a) can operate as a high-capacitance node. When sensing high-conducting cells, the signal at the node 630 may discharge faster than it would for non-conducting memory cells. As such, the sensing circuit 602a may sense the signal at node 630 to determine which of the sensed cells are highly conducting and which are non-conducting. Similarly, with respect to the sensing circuit 602b, the signal at the node 630a may discharge faster for high-conducting cells as compared to non-conducting cells, and thus, the signal at node 630a can be used to determine whether a sensed cell is highly conducting or non-conducting.

An example charge-storing device 644a and an example charge-storing device 644b are also shown in FIGS. 6A and 6B, respectively. The charge-storing devices 644a, 644b may be configured to store electric charge. In general, the charge-storing devices 644a, 644b may be any type of circuit component or combination of circuit components configured to store charge and generate a voltage based on the stored charge. For example, the charge-storing devices 644a, 644b may be capacitors. Alternatively, other circuits or combinations of circuits, including active circuits, passive circuits, or combinations thereof may be used to implement the charge-storing devices 644a, 644b. The charge-storing device 644a may include a first end or terminal connected to the sense node 630 and a second end or terminal connected to a pulse node 641. Similarly, the charge-storing device 644b may include a first end or terminal connected to the sense node 630a and a second end or terminal connected to the pulse node 641. In the configuration of sensing circuit 602b, the capacitance of the charge-storing device 644b may be selected so that the capacitance at the node 630a is larger than the capacitance at the node 630b. For example, the capacitance at the node 630a (including the capacitance of the charge-storing device 644b) may be larger than the combination of the parasitic capacitance, the intentional routing capacitance, and the junction capacitance of the node 630b. In some embodiments, the capacitance at the node 630a is, for example, at least 4, 5, 8, 10, 12, 15, or 20 times larger than the capacitance at the node 630b, though lower and/or other capacitance values may be used in certain circumstances. In some embodiments, the node 630a has a capacitance of 15-30 fF, while the node 630b has a capacitance of 3-8 fF.

The sense circuits 602a, 602b may also include respective sense pre-charge (SPC) transistors 346a, 346b that have respective gate terminals configured to receive respective control signals 647a, 647b from the sensing circuit controller 508, respective drain terminals configured to receive a high supply voltage, $V_{HLB}$, 648, and respective source terminals connected to the nodes 630, 630b, respectively. The sensing circuit controller 508 may output the control signals 647a, 647b to turn on the respective transistors 646a, 646b in order to set the respective nodes 630, 630b to certain voltage levels at certain, predetermined times before a sense operation.

Voltage supply circuitry may be configured to generate an input or pre-sense pulse clock signal and supply the input pulse clock signal to the charge-storing devices 644a, 644b. In particular, the voltage supply circuitry may supply the input pulse clock signal to the pulse node 641, and the charge-storing devices 644a, 644b may receive the input pulse clock signal by virtue of having their respective second ends connected to the pulse node 641. By virtue of receiving the pulse on the node 641, for example, voltage levels of nodes 630a and 630b may be increased, thereby allowing the discharge through the sense enable transistor 632b to occur when the sense enable transistor 632b is turned on. After the discharge, the pulse node 641 may be clocked down from the input pulse clock signal to 0. Then, a strobe operation can occur by turning on strobe transistor 636b (or strobe transistor 636a in the case of sensing circuit 602a).

In addition, the sensing circuit 602a may include a first series-connected branch of transistors that includes the strobe transistor 636a and a sense transistor 638a. Similarly, the sensing circuit 602b may include a second series-connected branch of transistors that includes the strobe transistor 636b and a sense transistor 638b. A gate terminal of the sense transistor 638a may be connected to the sense node 630 and configured to receive the sense voltage (e.g. $V_{SEN}$), and a gate terminal of the sense transistor 638b may be connected to the sense node 630b and configured to receive the sense voltage $V_{SEN}$. In addition, respective drain terminals of the sense transistors 638a, 638b are connected to respective source terminals of strobe transistors 636a, 636b and respective source terminals of the sense transistors 638a, 638b are connected to node 642. Node 642 may be configured to receive a rail voltage $V_{SS}$. Optionally, while node 641 is receiving a voltage pulse, node 642 may receive the same voltage to further boost the node 630b (or in the case of sensing circuit 602, node 630) by utilizing the gate capacitance of the sense transistor 638b (or sense transistor 638a, as the case may be). In addition, the strobe transistors 636a, 636b have respective gate terminals configured to receive respective control signals 637a, 637b from the sensing circuit controller 508.

As previously alluded to, it may be advantageous to increase the sense margin of a sensing circuit. For an existing sensing circuit configuration, such as that of sensing circuit 602a, one approach for increasing the sense margin is to increase the high supply voltage 648 or to reduce the threshold voltage, for example, $V_{tsen}$, of the sense transistor 638a. While embodiments of the disclosed technology employ an improved approach that results in a larger sense margin increase than these conventional approaches, it should be noted that the conventional approaches are not precluded from being combined with improved approaches according to embodiments disclosed herein in order to provide for even greater sense margin increases.

Figure 7:
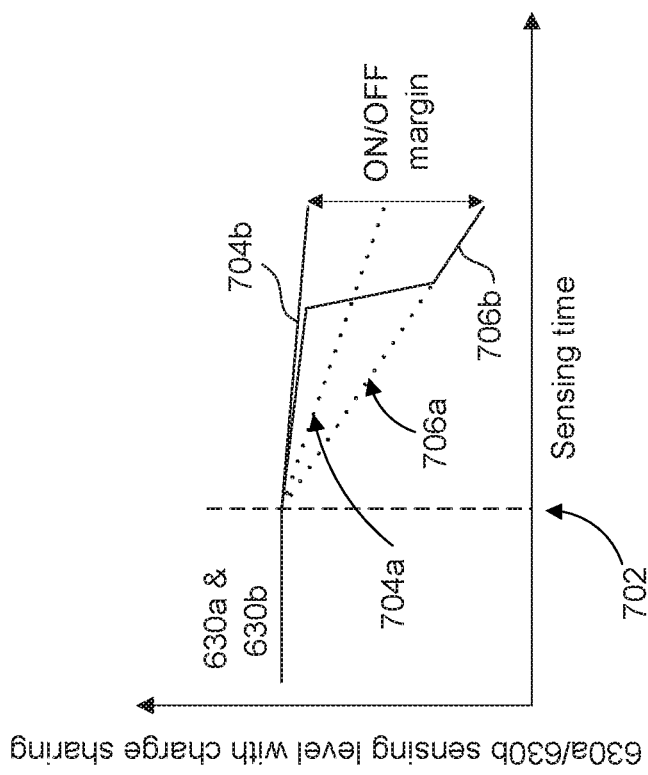
FIG. 7 shows sensing signal levels in a sensing circuit having the configuration of FIG. 6A in comparison to sensing signal levels in a sensing circuit having the digitized configuration of FIG. 6B, with a visualization of the improved sensing time margin in the sensing circuit configuration of FIG. 6B, in accordance with various embodiments of the disclosed technology.
Figure 7:
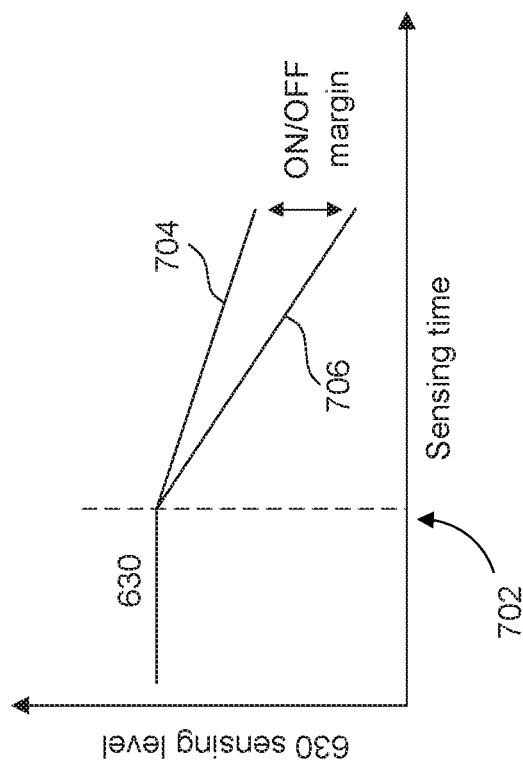

FIG. 7 illustrates a plot of the sensing signal levels in the sensing circuit 602a and the sensing signal levels in the sensing circuit 602b as a function of sensing time. As noted earlier, a sense voltage at the sense node 630 may be at a pre-sense voltage level that corresponds to the sum of the voltage level of node 648 (VHLB) and the product of an input pulse clock signal at node 641 with a coupling ratio Cr of the charge-storing device 644a (e.g., SEN=VHLB+CLK*Cr). Moreover, the rate of discharge may be a function of the current at or into the memory cell being sensed (e.g., the current received from node 612).

The plot on the left side of FIG. 7 shows, by way of curves 704 and 706, the charge level at node 630 in the configuration of sensing circuit 602a from a point in time when the node 630 is pre-charged (i.e., by pre-charging through transistor 646a and then clocking up the signal at the pulse node 641) through the commencing of sensing at time 702, and again through the discharge of the node 630. The plot on the right side of FIG. 7 shows, by way of curves 704b and 706b, the charge level at node 630b in the configuration of sensing circuit 602b from a point in time when the node 630a is pre-charged (i.e., by pre-charging through transistor 646b and then clocking up the signal at the pulse node 641), through the commencing of sensing at time 702, and again through the discharge of node 630a.

The curve 704 in the plot on the left side of FIG. 7 represents a voltage of the node 630 for a non-conducting cell, and the curve 706 represents a voltage of the node 630 for a highly conducting cell. The dotted lines in the plot on the right side of FIG. 7 correspond to voltage levels of the node 630a, where the curve 704a represents a voltage of the node 630a for a non-conducting cell and the curve 706a represents a voltage of the node 630a for a highly conducting cell. The solid lines correspond to voltage levels of the node 630b, where the curve 704b represents a voltage of the node 630b for a non-conducting cell and the curve 706b represents a voltage of the node 630b for a highly conducting cell. The double-sided arrow lines for the ON/OFF sense margins in both plots correspond to a same sensing time. As illustrated in FIG. 7, the ON/OFF margin for the configuration of sensing circuit 602b—which includes nodes 630a and 630b—has a larger ON/OFF sense margin at a given sensing time as compared to the configuration of sensing circuit 602a, which includes node 630. As a result of the increased ON/OFF sense margin, the configuration of circuit 602b maintains its sensing accuracy, while at the same time, being less sensitive to sensing time and noise.

In the configuration of sensing circuit 602b, the voltage level at node 630a may be a function of the current at (or into) the memory cell. In some embodiments, when the node 630a begins discharging, the sensing circuit controller 508 (or another peripheral circuit) may apply control signal 633a to turn on the transistor 633. In some embodiments, if the node 630a has a voltage level that is less than a difference between the control signal 633a and a threshold voltage, $V_{th}$, of the transistor 633, the node 630b begins to discharge. This charge sharing between nodes 630a and 630b may occur during a sensing time (e.g., sensing time 907 described in more detail later in this disclosure with reference to FIG. 9) or a charge sharing time (e.g., charge sharing time 909, also described in more detail later in this disclosure with reference to FIG. 9). If, on the other hand, the node 630a does not have a voltage level that is less than a difference between the control signal 633a and the threshold voltage $V_{th}$ of the transistor 633, the node 630b may not discharge (or may otherwise experience very little discharge) and may remain high. The above-described charge sharing behavior may result in the curve 704b (representing the voltage level of node 630b of circuit 602b for a non-conducting cell) being higher than the curve 704 (representing the voltage level of node 630 of circuit 602a for a non-conducting cell) at various sensing times. This, in turn, may result in the larger ON/OFF sense margin, as shown in the plot on the right side of FIG. 7.

The importance of increasing the ON/OFF sense margin may become apparent when noise is injected into the signals when latched at the latching circuit 506. Any noise injected into the signals can disturb the voltage level when latched. When the ON/OFF margin is small, any noise at the ON signal and/or the OFF signal level may cause a false reading of the memory cell or otherwise increase the fail bit count. Thus, by increasing the ON/OFF margin, or in other words, increasing the difference between the voltage level corresponding to a high-conducting memory cell and a non-conducting memory cell, embodiments of the disclosed technology provide increased sensing accuracy and/or a decreased fail bit count.

As previously mentioned, the OFF voltage level versus the ON voltage level may depend on the current. For example, referring to the plot on the left side of FIG. 7, the curve 706 may represent the voltage level sensed at node 630 for high-conducting cells. The curve 704, on the other hand, may represent the voltage level sensed at node 630 for non-conducting cells. As illustrated by the steeper decline of curve 706 as compared to curve 704, the signal at node 630 discharges faster for highly conducting cells than for non-conducting cells. A similar phenomenon is observed with respect to the signal at node 630a of sensing circuit 602b for non-conducting cells (represented by curve 704a) as compared to the signal at node 630a for high-conducting cells (represented by curve 706a). Moreover, as a result of the above-described charge sharing behavior between node 630a and node 630b, the curve 704b (representing the voltage level at node 630b of sensing circuit 602b for non-conducting cells) exhibits a much less steep decline than the curve 704 (representing the voltage level at node 630 of sensing circuit 602a for non-conducting cells), thereby resulting in the larger ON/OFF sense margin between curves 704b and 706b than what is observed between curves 704 and 706.

In particular, for a non-conducting cell, if the transistor 633 does not turn on, the voltage at the node 630b may essentially remain at the rail or pre-charge level, as represented by curve 704b. When the transistor 633 turns on, because the capacitance at node 630b is smaller than at node 630a (e.g., 4-10 times smaller), the charge at node 630b can be dumped at node 630a, as represented by curve 706b. The margin between a detected ON cell (e.g., a highly conducting cell) and an OFF memory cell (e.g., a non-conducting cell), as detected at node 630b, can thus become quite large. This is represented by the increased ON/OFF margin between curves 704b and 706b.

Figure 8:
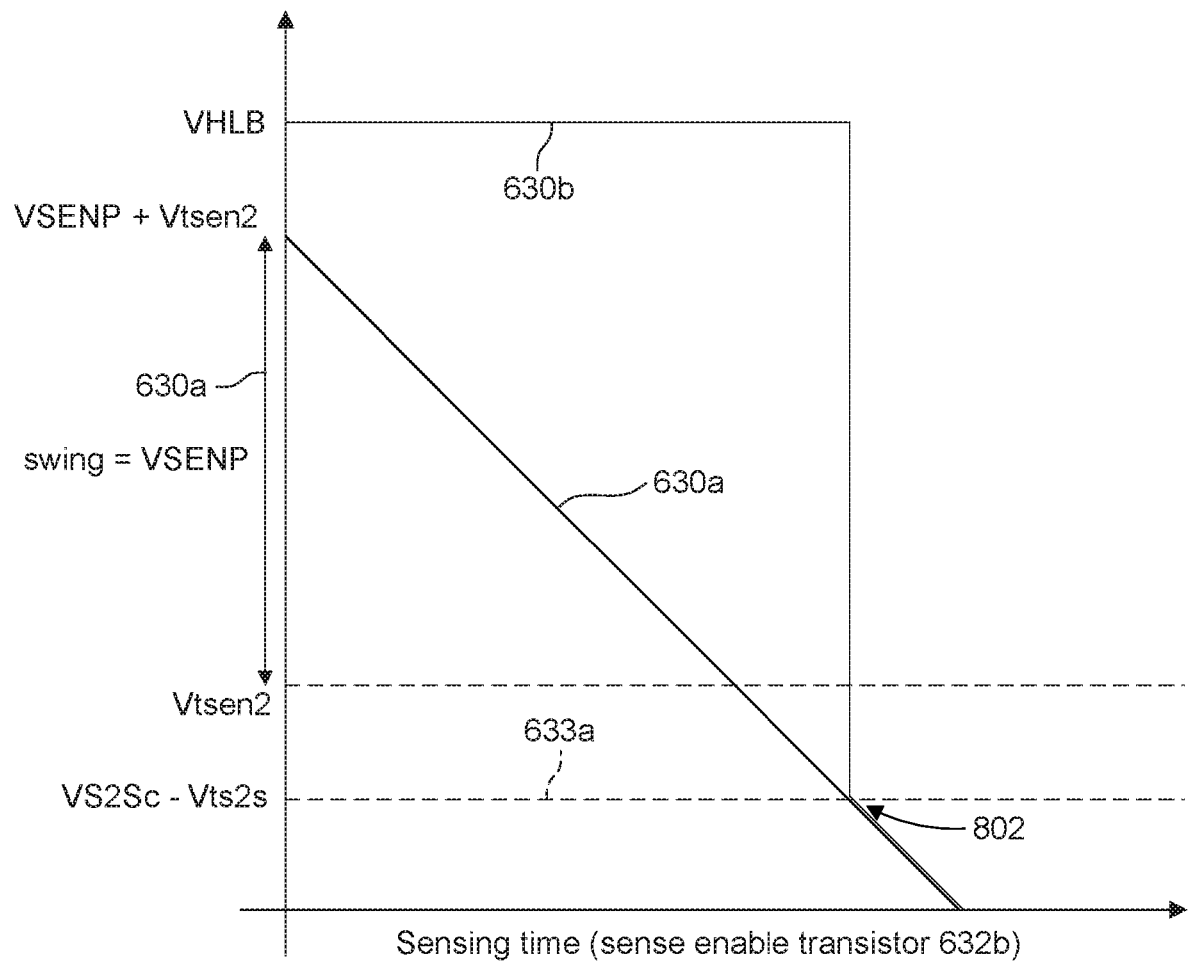
FIG. 8 is an example of charge sharing between sensing nodes, which may be used to implement various features of embodiments of the disclosed technology.

FIG. 8 shows a graph of charge sharing between the nodes 630a and 630b in accordance with various embodiments disclosed herein. Specifically, the voltage levels at nodes 630a, 630b after the sensing starts are shown. In various embodiments, nodes 630a and 630b can be sensed. When the voltage level at node 630a is below a difference between the gate voltage $V_{S2Sc}$ of the transistor 633 and the threshold voltage $V_{ts2s}$ of the transistor 633, then the transistor 633 turns on, and nodes 630a and 630b start charge sharing. Stated in an alternative but equivalent way, when the gate voltage $V_{S2Sc}$ of the transistor 633 is greater than the sum of the voltage at node 630a and the threshold voltage $V_{ts2s}$ of the transistor 633, then the transistor 633 turns on, and nodes 630a and 630b start charge sharing. This is illustratively depicted in FIG. 8 as occurring at sensing time 802. Because node 630a typically has a much bigger capacitance than node 630b, node 630b can discharge from the high supply voltage 648 level to the node 630a level. As a result, node 630b is "digitized" based on the node 630a level. In particular, if node 630a is lower than the difference between the gate voltage $V_{S2Sc}$ of the transistor 633 and the threshold voltage $V_{ts2s}$ of the transistor 633, the node 630b will dump charge to node 630a and the voltage level at node 630b will decrease. If node 630a is higher than the difference between the gate voltage $V_{S2Sc}$ of the transistor 633 and the threshold voltage $V_{ts2s}$ of the transistor 633, then transistor 633 will remain off and node 630b will remain high. This is illustrated by the voltage levels for nodes 630a, 630b shown in FIG. 8 to the left of sensing time 802.

Figure 9:
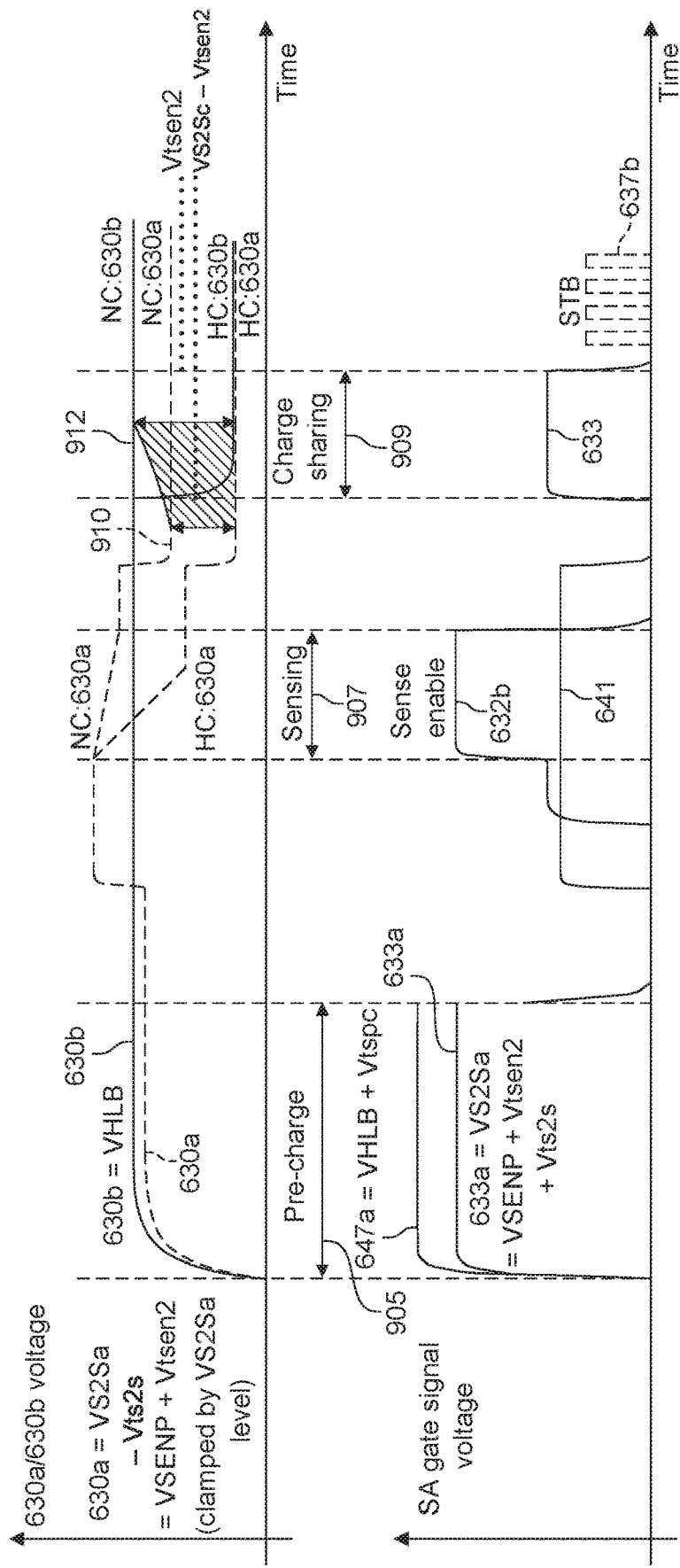
FIG. 9 shows example waveforms according to various embodiments of the disclosed technology.

FIG. 9 shows example waveforms for the implementation of circuit 602b of FIG. 6B. The top half of FIG. 9 illustrates the SEN1 voltage (corresponding, for example, to the voltage at the node 630a of the sensing circuit 602a) and the SEN2 voltage (corresponding, for example, to the voltage at the node 630b of the sensing circuit 602b) over time. The bottom half of FIG. 9 illustrates various gate signal voltage levels over time. The sense pre-charge (SPC) control signal 647b may be applied at the gate of the transistor 646b, a strobe control signal 637b may be applied at the gate of the strobe transistor 636b, a sense enable signal may be applied at the gate of sense enable transistor 632b, and a control signal 633a may be applied at the gate of transistor 633. A signal, such as the input pulse clock signal described herein, may be applied at pulse node 641. The various gate signal voltage levels, as well as the signal applied at pulse node 641 may be generated (directly or indirectly) at sensing circuit controller 508 and/or other peripheral circuitries. For example, control logic circuitry that may form part of peripherical circuitry may be configured to allow for generation of one or more of the signals shown in FIG. 9. Although a specific order for the various control signals is illustrated in the bottom half of FIG. 9, it should be understood that the depicted order for the various control signals to reach a high and/or low level is merely illustrative and not exhaustive.

A pre-charge time period 905 for the nodes 630a and 630b and a sensing time period 907 are shown in FIG. 9. For memory systems that perform sense operations, such as the memory system 100 shown and described with reference to FIGS. 1-5, thousands of sense circuits may simultaneously perform their respective sense operations as part of a read or verify process. The pre-charge operation consumes power, and as such, power consumption within the memory system can be reduced by configuring and controlling the sense circuits so that only those sense circuits connected to selected bit lines perform the pre-charge operation. It should thus be understood that, in some embodiments, pre-charging, sensing, and charge sharing operations may only be performed at selected bit lines.

During the pre-charge time period 905, nodes 630a and 630b may be at least partially pre-charged. In particular, during the pre-charge period 905, the transistor 646b may turn on based, for example, on the SPC control signal 647b applied at the gate of the transistor 646b, where the SPC control signal 647b is the sum of the high supply voltage 648, $V_{HLB}$, and the threshold voltage of the transistor 646b, $V_{tspc}$. Further, the transistor 633 may be turned on as a result of application of the control signal 633a, $V_{S2Sa}$, which may correspond to the sum of the voltage swing for the node 630a, $V_{SENP}$, the threshold voltage for the sense transistor 638b, Vtsen2, and the threshold voltage of the transistor 633, Vts2s. As a result, during pre-charge time period 905, the node 630b level may be pre-charged to the high supply voltage 648, and the node 630a may be clamped by the gate signal 633a and may have a voltage level given by $V_{S2Sa}-V_{ts2s}$=the voltage swing, $V_{SENP}+V_{tsen2}$. It should thus be understood that various signals applied during pre-charge period 905 may allow for pre-charging node 630b to a first level and pre-charging node 630a to a clamped level. Prior to the sensing time period 907, the node 630a can be further charged by activating a signal at node 641, e.g., by application of pre-sense input pulse clock signal at the node 641. In other words, the level at node 630a can increase to a level greater than the previously clamped level (i.e., to a level above the level during the pre-charge period 905) by capacitive coupling through the charge-storing device 644b.

Although node 630a is shown as at least partially pre-charging by activation of the transistor 633 before the input pulse clock signal is applied at node 641, it should be understood that the transistor 633 need not be activated during the pre-charge 905 time, but rather that the node 630a can be coupled up by an input pulse clock signal at node 641 through the charge-storing device 644b.

During the sensing time period 907, the sense enable transistor 632b is turned on. When sense enable transistor 632b turns on, the sensing circuit 602b is able to couple to the memory cell and a current can drain to the coupled memory cell. During this same sensing time period 907, the transistor 633 may be off (see curve in FIG. 9 that corresponds to transistor 633). That is, while during the pre-charge period 905, the transistor 633 may be on, during the sensing period 907, the transistor 633 may be off. As such, in example embodiments, during the sensing period 907, node 630a discharges but node 630b stays at or near the charged level of the high voltage supply 648. The node 630b level is shown as the solid line NC:630b in the case of sensed non-conducting memory cells and as solid line HC:630b in the case of high-conducting memory cells. Stated another way, the memory cells can discharge a charge accumulated at the node 630a, but not a charge accumulated at the node 630b.

The discharge of node 630a during the sensing period 907 is illustrated in FIG. 9 by two curves, one curve labeled NC:630a, which corresponds to non-conducting memory cells, and another curve labeled HC:630a, which corresponds to sensed high-conducting memory cells. As shown for the time period 907, the charge stored at node 630a discharges more rapidly for the high-conducting memory cells than for the non-conducting memory cells. After sensing, the charge sharing period 909 begins, during which, node 630a and node 630b can share charges. Specifically, during this period 909, the transistor 633 can turn on. As previously described, during charge sharing 909, if the voltage level at node 630a is greater than (or equal) to $V_{S2Sc}-V_{ts2s}$, the transistor 633 may remain off, and node 630b may retain its high level. As explained further below, the difference between the gate voltage $V_{S2Sc}$ and the threshold voltage $V_{ts2s}$ of transistor 633 can be selected to be lower than the threshold voltage $V_{tsen2}$ for sense transistor 638b in order to ensure a sense margin gain.

In example embodiments, if a voltage at node 630a is less than (or equal to) $V_{S2Sc}-V_{ts2s}$, the transistor 633 turns on, and node 630b discharges to the node 630a charge level due to charge sharing and because node 630a has much larger capacitance than node 630b. In the case of a non-conducting memory cell, because node 630a has a voltage level higher than $V_{S2Sc}-V_{ts2s}$ (see NC:630a curve higher than the $V_{S2Sc}-V_{ts2s}$ curve during the charge sharing period 909), node 630b may not discharge (see NC:630b curve) due to the transistor 633 remaining off. The difference 912 between the levels of the NC:630b and HC:630b curves is larger than the difference 910 between the levels of the NC:630a and HC:630a curves. As such, the sensing circuit 602b results in an amplified ON/OFF margin as compared to the sensing circuit 602a, as reflected by the sense margin difference 912 being greater than the sense margin difference 910.

As can be seen in the time period following the charge sharing time period 909, the strobe transistor 636b can be used for latching the signals to a latching circuit 506. Additionally, the strobe control signal 637b of the strobe transistor 636b may correspond to the STB waveform 637b shown in FIG. 9.

As described earlier, conventional approaches for increasing the sense margin include increasing the high supply voltage 648 and/or reducing the threshold voltage $V_{tsen}$ of the sense transistor 638a. For example, the higher the single pre-charge level ($V_{SENP}$) (e.g., the voltage swing), the higher the sense margin. Stated another way, the higher voltage that the node 630a can be pre-charged to, the larger the voltage swing, $V_{SENP}$. In example embodiments, the voltage swing $V_{SENP}$ is based on the high supply voltage 648 and the threshold voltage $V_{tsen}$ of the sense transistor 638a. In other words, node 630a can be pre-charged to the sum of the swing voltage, $V_{SENP}$, and the threshold voltage $V_{tsen}$ of the sense transistor 638a. Conventionally, when node 630a is lower than the threshold voltage of the sense transistor 638a, and the strobe transistor 636a is turned on or strobed, the strobe transistor 636a will not discharge. On the other hand, when node 630a is higher than the threshold voltage of the sense transistor 638a, then the strobe transistor 636a drain node (which is coupled to data latches) is able to discharge.

It should be appreciated that the above-described conventional approaches for improving sense margin can be combined with the improved approaches according to embodiments of the presently disclosed technology in order to achieve even greater gains in sense margin. For example, the higher the swing voltage (corresponding to the swing at node 630a), the better the sense margin. In other words, the higher the node 630a can be pre-charged to, the better the swing voltage of the node 630a. As noted, the voltage swing is based on the high supply voltage 648 and the threshold voltage $V_{tsen2}$ for the sense transistor 638b.

The above-described conventional approaches for increasing sense margin are limited, however. Increases in the high supply voltage 648 are limited by the capacity of the power control circuitry 116 to generate and supply voltages, as well as, by the various thermal control systems and size limitations of the memory die 108. As such, it may not be desirable to increase the high supply voltage 648 to achieve an increased sense margin. Further, the silicon process limits the lowest value that can be obtained for the threshold voltage of the sense transistors 638a ($V_{tsen}$), 638b ($V_{tsen2}$). In particular, for example, there may be physical limits on the extent to which the channel length can be reduced and the amount by which the oxide (or other insulator) thickness between the gate and the inversion layer of charge below the oxide can be reduced. Further, local variations can make it difficult to control the threshold voltages for the respective sense transistors 638a, 638b of the sensing circuits 602a, 602b. Further, reducing impurities in the die making process so that the channel length can be reduced and local variations can be controlled comes at the expense of increased costs, increased testing time, and an increased number of discarded memory dies. As such, while these conventional approaches are candidates to be used in conjunction with the improved approaches for increasing sense margin disclosed herein, they suffer from a number of technical limitations that may make them less desirable to employ, in which case, the improved techniques for increasing sense margin disclosed herein can be employed to an alternative and even greater increase in the sense margin.

Figure 10A:
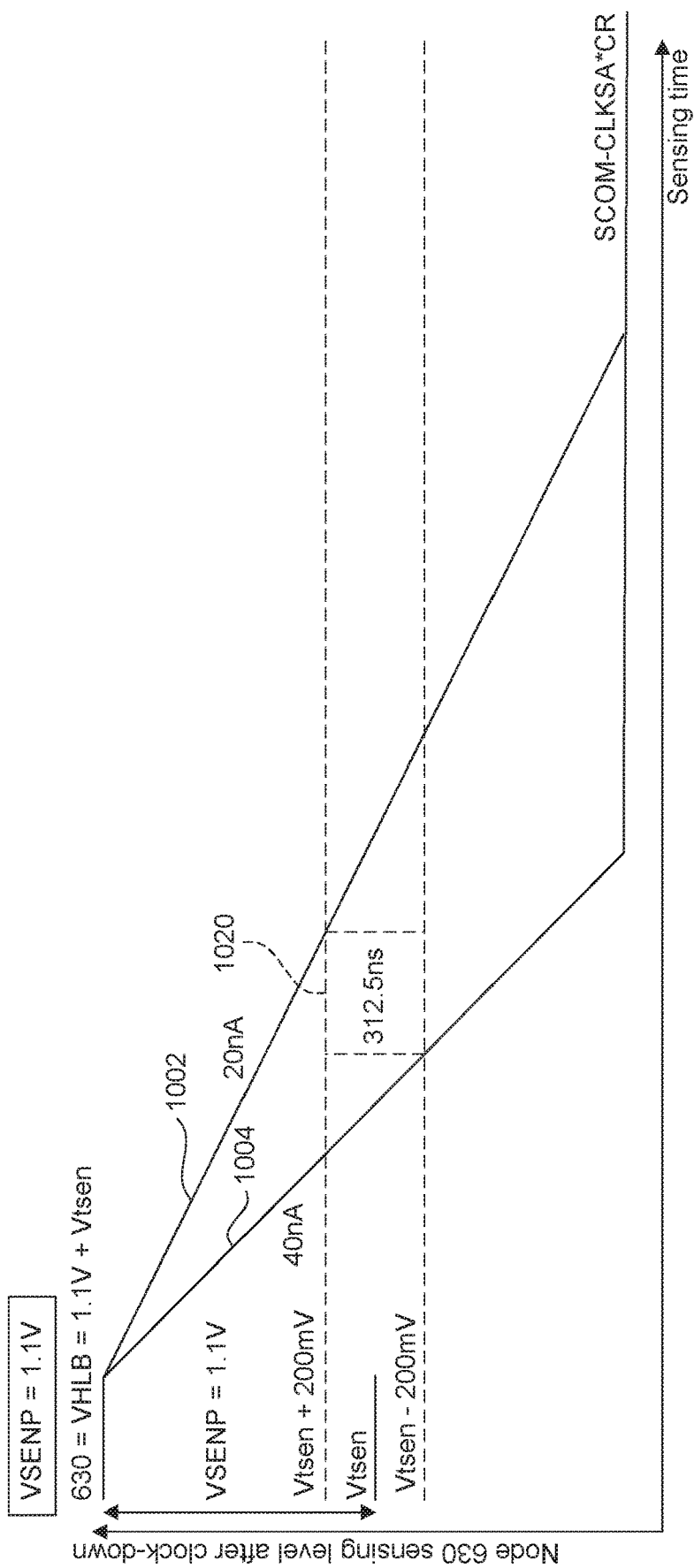
FIG. 10A shows an example sense margin according to various embodiments of the disclosed technology.
Figure 10B:
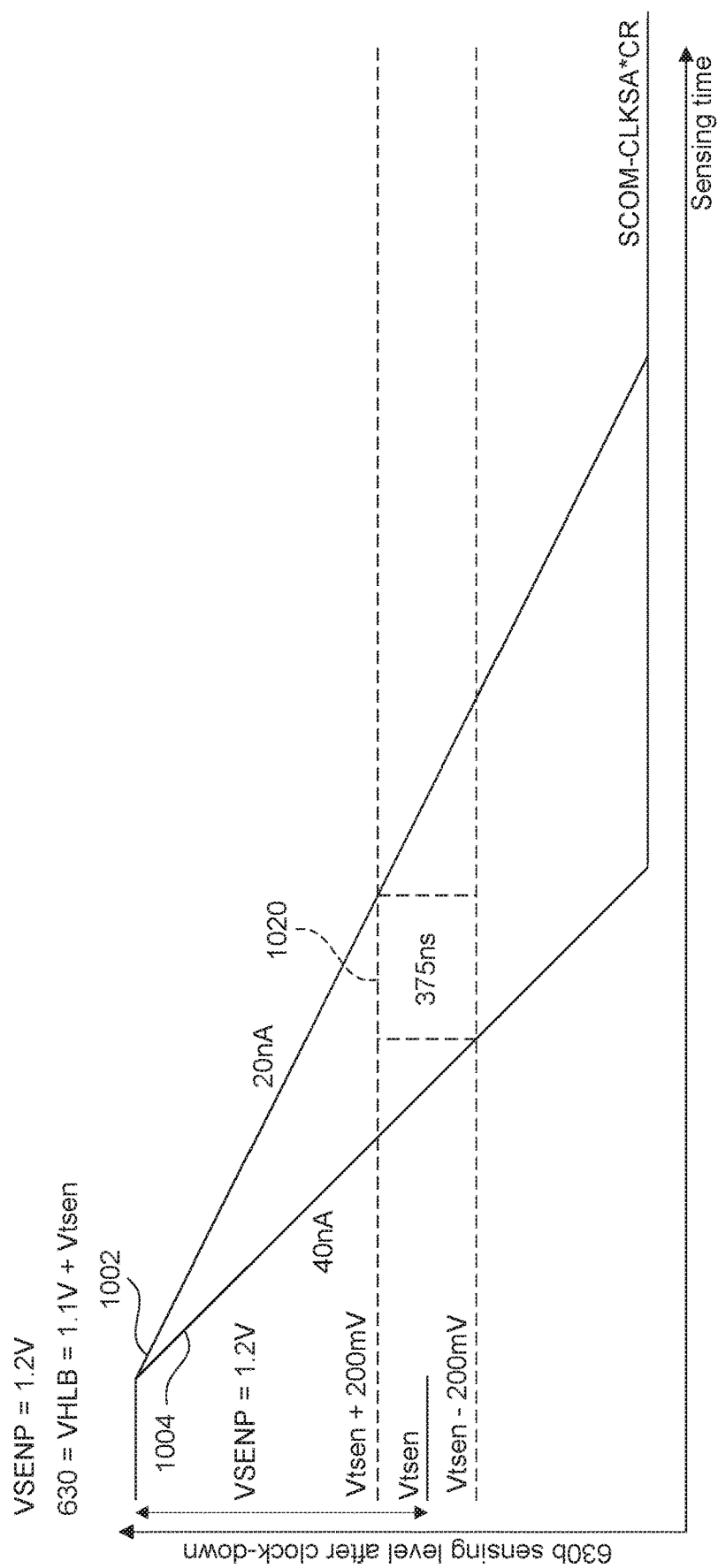
FIG. 10B shows, in comparison to FIG. 10A, an example included sense margin according to various embodiments of the disclosed technology.

As will be discussed with reference to FIGS. 10A, 10B, and 11 hereinafter, methods and systems disclosed herein allow for significant improvements in the sense margin as compared to conventional approaches that rely on increasing the high supply voltage 648, increasing the voltage swing $V_{SENP}$, and/or reducing the threshold voltage $V_{tsen}$ for the sense transistor 638a. FIGS. 10A and 10B show the voltage level at node 630 level in the circuit 602a of FIG. 6A before (FIG. 10A) and after (FIG. 10B) the high supply voltage 648 is increased. In other words, FIG. 10B shows an example method of increasing the sense margin for the configuration of FIG. 6A by increasing the high supply voltage 648.

In this example, the total capacitance (i.e. capacitance of the capacitive element of the charge-storing device 644a and other intrinsic capacitance such as routing capacitance) at node 630 may be 25 fF. Further, node 630 may swing from the high supply voltage 648 during the pre-charging period to the difference between the voltage level of node 612 (SCOM) and the product of the voltage level of the input pulse clock signal at node 641 (CLKSA) and a coupling ratio (Cr) for the charge-storing device 644a after clock-down. In other words, as shown in FIGS. 10A and 10B, after clock-down from an input pulse clock signal to 0 at node 641, the voltage of node 630 can swing from the high supply voltage 648 to a voltage equal to SCOM−CLKSA*Cr. The curve 1002 corresponds to a 20 nA current, while the curve 1004 (lower) corresponds to a 40 nA current.

The local variations in the sense transistor 638a threshold voltage are captured by introduction of the ±200 mV swing in the sense transistor 638a threshold voltage. FIG. 10A shows the sense margin 1020 with a voltage swing of 1.1V, whereas FIG. 10B shows the sense margin when the voltage swing is increased to 1.2V. In some embodiments, the sense margin box 1020 may represent an extent to which the sensing time is inaccurate for differentiating the curve 1004 from the curve 1002. Because the curve 1004 discharges faster than the curve 1002, the longer the sensing time, the more tolerant to inaccuracies the sensing circuit may be. Before the signals reach the sense margin box 1020, the greatest separation between the curve 1004 and the curve 1002 is desirable.

As previously mentioned, the voltage swing can be increased. FIG. 10B illustrates an increase in the voltage swing of the node 630 from 1.1V (FIG. 10A) to 1.2V. Compared to the example of FIG. 10A, by increasing the high supply voltage 648 and/or reducing the sense transistor 638a threshold voltage by 0.1V, the sense margin 1020 increases from 312.5 ns in the example of FIG. 10A to 375 ns in the example of FIG. 10B, an increase of about 20%.

Figure 11:
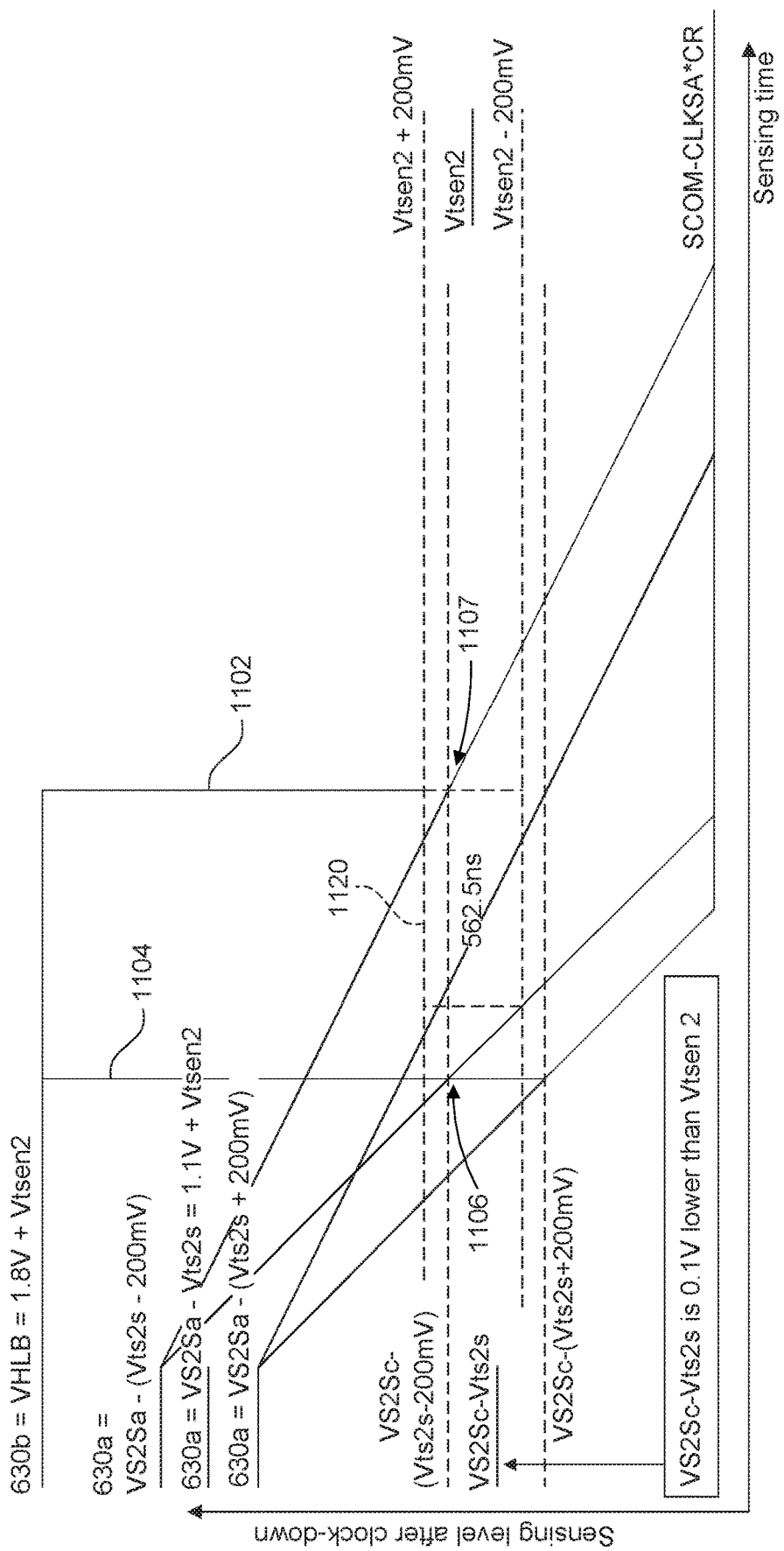
FIG. 11 shows, in comparison to FIG. 10A and FIG. 10B, an increased sense margin achieved by utilization of the circuit configuration of FIG. 6B according to various embodiments of the disclosed technology.

FIG. 11 shows the sense margin in the circuit of FIG. 6B that employs the "digital" sensing method disclosed herein along with variations in the transistor 633 threshold voltage. The variations are captured with reference to edge case curves of ±200 mV around the threshold voltage of the transistor 633. The clamp level of node 630a varies based on variation in the threshold voltage of the transistor 633. FIG. 11 also illustrates variations in the sense transistor 638b threshold voltage. The voltage level of node 630b for a sensed high-conducting memory cell is represented by curve 1104, and the voltage level of node 630b for a sensed non-conducting memory cell is represented by curve 1102. Further, a sense margin box 1120 of 562.5 ns is shown. Compared to the circuit of FIG. 10A, which exhibited a sense margin of 312.5 ns for the configuration of FIG. 6A, the circuit to which the plot of FIG. 11 corresponds has a similarly high supply voltage 648 and similar voltage thresholds for the sense transistor 638a. The circuit to which FIG. 11 corresponds, however, has a sense margin of 562.5 ns, which constitutes an 80% increase over the sense margin of FIG. 10A, and a 50% increase over the sense margin of FIG. 10B (which itself was larger than the sense margin of FIG. 10A due to the 0.1V increase in the high supply voltage). Thus, as illustrated in FIG. 11, the digital sensing scheme according to embodiments of the disclosed technology allows for a substantially increased sense margin, without requiring any conventional techniques for increasing the sense margin such as reducing the voltage threshold of the sense transistor 638b or increasing the high supply voltage 648. As shown in FIG. 11, node 630b, in the case of a non-conducting cell, retains its high level inside the sensing window 1120, even in cases of worst case threshold voltage variation of ±200 mV.

In embodiments, the clamp level of node 630a varies based on the transistor 633 variation (e.g. variations in the threshold voltage of the transistor 633). The parameters for the transistor 633 can be selected such that a difference between the gate voltage, $V_{S2Sc}$, of the transistor 633 and the threshold voltage $V_{ts2s}$ for the transistor 633 is lower than the threshold voltage $V_{ts2s}$ for the sense transistor 638b. In some embodiments, such as that depicted in FIG. 11, for example, $V_{S2Sc}-V_{ts2s}$ is 0.1V lower than $V_{tsen2}$. In other embodiments, $V_{S2Sc}-V_{ts2s}$ may be 0.2V, 0.3V, 0.4V, or 0.5V lower than the threshold voltage for the sense transistor 638b. In some embodiments, as $V_{S2Sc}-V_{ts2s}$ level goes lower than $V_{tsen2}$, the sense margin can increase significantly. In some embodiments, when node 630a is lower than $V_{S2Sc}-V_{ts2s}$ including any threshold voltage variation (see point 1106 for the curve 1104 case, and point 1107 for the curve 1102 case), the node 630b will discharge.

As previous mentioned, there may be many sensing circuits and sense blocks. Because of how the circuits are arranged (i.e. on the memory die 108), it may be important to increase the sense margin so that variations across the multiple sensing circuits on the die are accounted for. As previously mentioned, adjustments may be made to account for the capacitance at node 630b. At the same time, however, local variations and the various positions of the sensing circuits 504 within the die may cause junction capacitances, routing capacitances, parasitic capacitances, etc. that make up the capacitance of node 630b to vary across the various sensing circuits 504. For example, the routing capacitance can depend on the specific layout of the memory die 108.

Figure 12A:
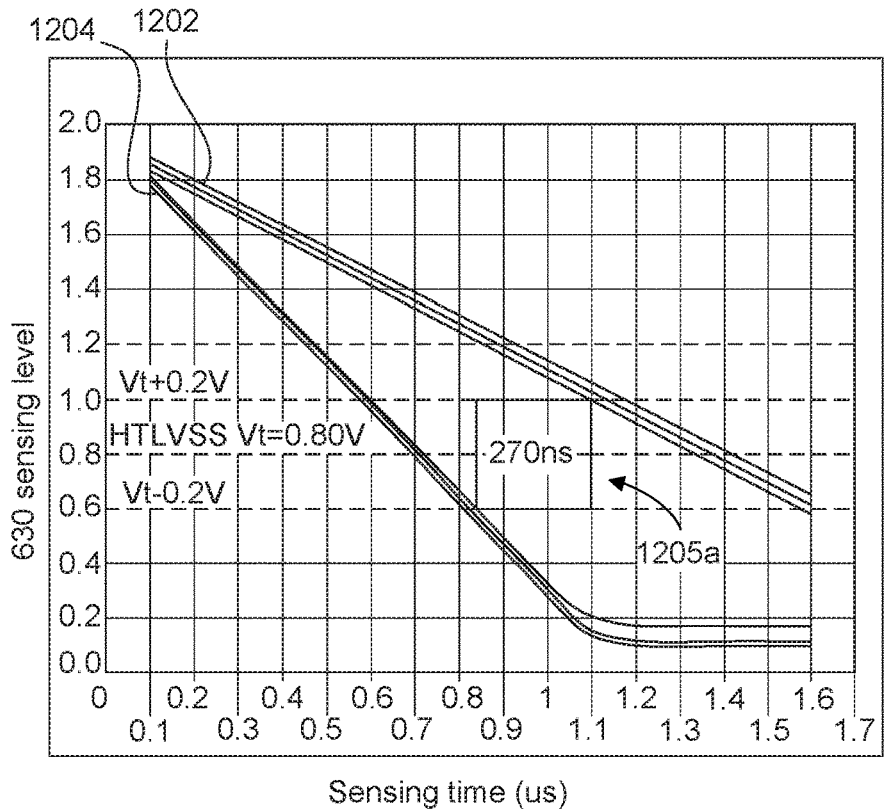
FIG. 12A shows a sense margin corresponding to a circuit having the configuration of FIG. 6A.
Figure 12B:
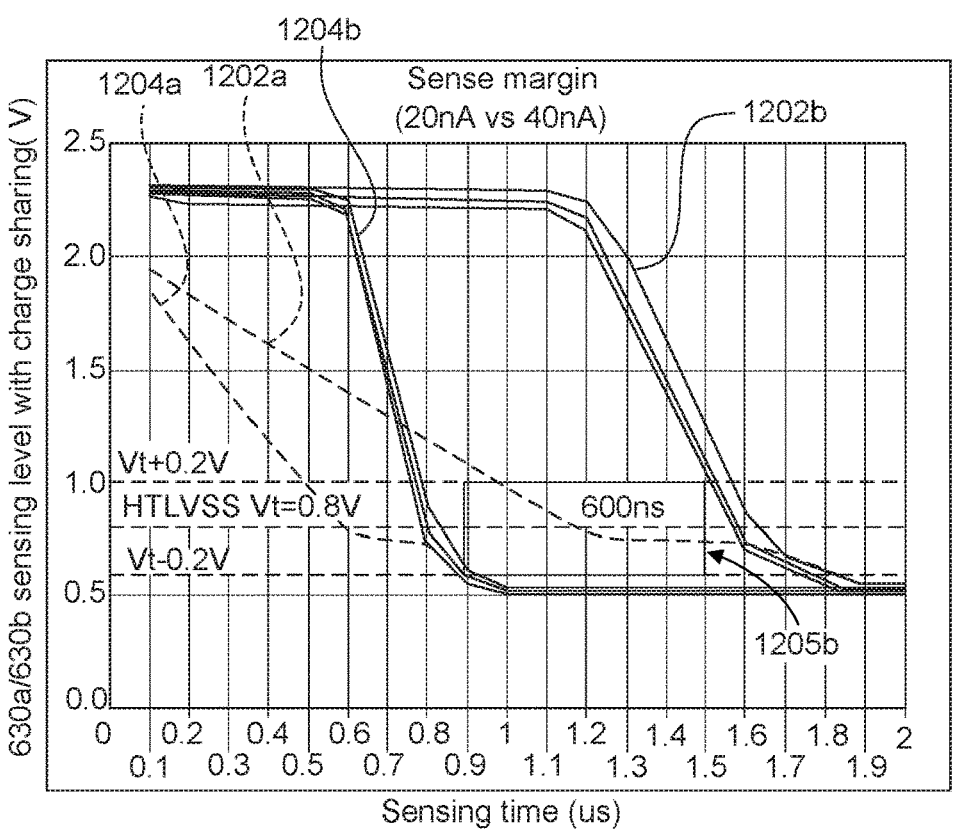
FIG. 12B shows an increased sense margin corresponding to a circuit having the configuration of FIG. 6B according to various embodiments of the disclosed technology.

Although the capacitance of the node 630 (and node 630a) of sensing circuits 602a and 602b, respectively, can be controlled to an extent if it includes a physical capacitor, there can still be various junction capacitances which contribute to variations in the capacitances of nodes 630 and 630a and to a capacitance and RC time constant across the various sensing circuits of the memory die 108. FIG. 12A shows the sensed node 630 of multiple sensing circuits of the configuration of sensing circuit 602a, where non-conducting memory cells (represented by curve 1202) have 20 nA current, and highly conductive memory cells (represented by curve 1204) have 40 nA current. FIG. 12B shows the sensed nodes 630a and 630b of multiple sensing circuits of the configuration of sensing circuit 602b (the "digitized" circuit variation). Non-conducting memory cells (represented by curves 1202a and 1202b depending on whether sensed at node 630a or node 630b) may have 20 nA current. Sensed values corresponding to highly conductive memory cells (represented by curves 1204*a* and 1204*b* depending on whether sensed at node 630*a* or node 630*b*) may have 40 nA current. The various curves in FIG. 12A are based on variations in the node 630. As previously alluded to, there can be local variations in respective node 630*b* capacitances for the die. The various curves shown in FIG. 12B are based on variations in the node 630*a* and node 630*b*, for example, using various simulated routing capacitances for the die. Variations in the sense transistors 638*a* and 638*b* are also captured in the vertical upper and lower bounds for the sense margin bounding boxes 1205*a* and 1205*b*. For example, with reference to node 630*b*, and sense transistor 638*b*, the local variations of the threshold voltages inherent to switching devices are captured in the ±200 mV variation in the bounding box of sense margin 1205*b*. It should be understood that ±200 mV is a worst case variation on threshold voltages, yet practical variations may be on the order of ±15 mV. Similarly, variations in the sense transistor 638*a* are captured by the bounding box of sense margin 1205*a*. The sense margins 1205*a*, 1205*b* generally show the impact variations can have. It can be seen, for example, that the greater variation in the sense transistors 638*a*, 638*b*, the greater variation in their respective threshold voltages. These variations can make the sense margin 1205*a*, 1205*b* narrower or shorter. For the sensing circuit 602*b* configuration that produces the results shown in FIG. 12B, the gate voltage for the "pre-charge" period, $V_{S2Sa}$, was selected to be 2V+the threshold voltage for the transistor 633, $V_{ts2s}$). Further, the gate voltage for the transistor 633 for charge sharing, $V_{S2Sc}$, was selected to be 0.6V+the threshold voltage for the transistor 633, Vts2s. $V_{S2Sc}-V_{ts2s}$ was selected to be 0.2V lower than $V_{tsen2}$=0.8V. In various embodiments, as long as $V_{S2Sc}-V_{ts2s}$ (and it's variation range) is higher than the SCOM–CLKSA*CR level described in FIG. 11, the lower the value for $V_{S2Sc}-V_{ts2s}$, the wider the sense margin.

As shown in FIGS. 12A and 12B, conventional sensing such as that performed by the sensing circuit configuration 602*a* of FIG. 6A, has a sense margin 1205*a* of 270 ns, while digital sensing performed, for example, by the digital sensing circuit configuration 602*b* of FIG. 6B according to embodiments of the disclosed technology has a much larger sense margin 1205*b* of around 600 ns.

Figure 13:
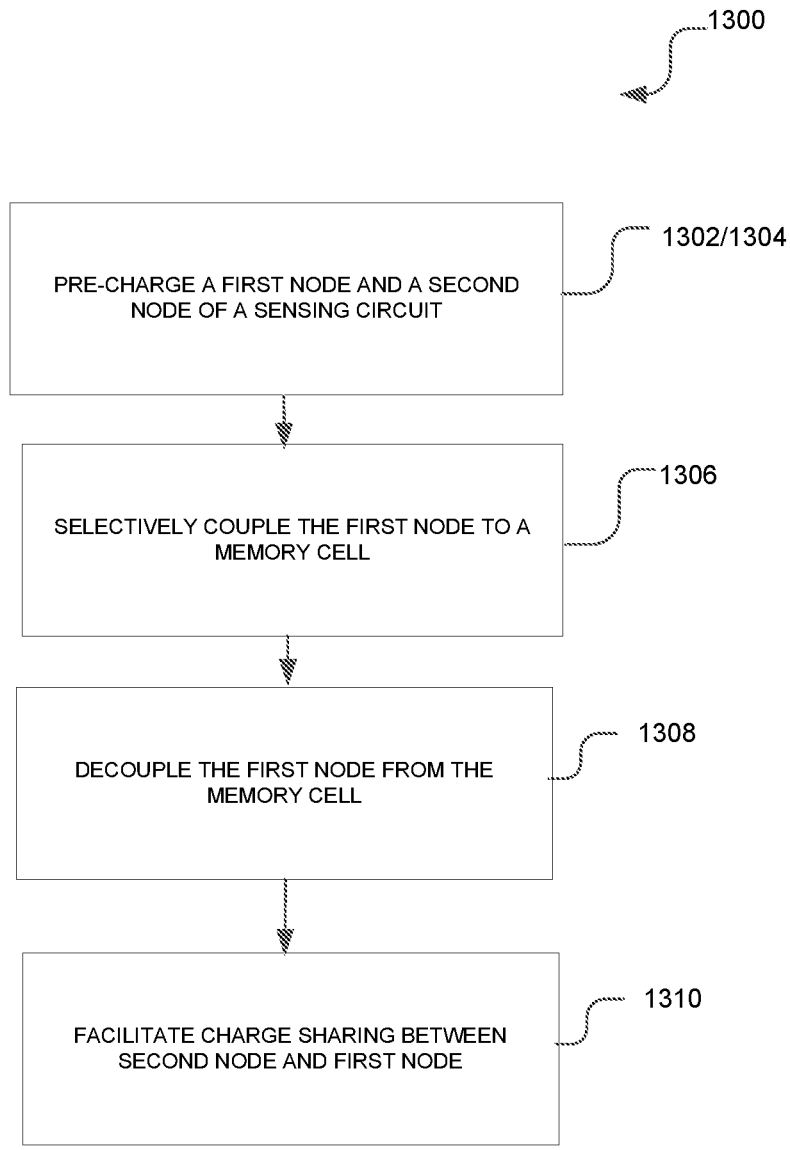
FIG. 13 shows example operations which can be performed for the implementation of various features of embodiments described in the present disclosure.

FIG. 13 shows various steps which can be performed by a controller (e.g., controller 122) or other control logic circuitry to execute one or more operations in performance of a method 1300. For example, the controller 122 can fetch, decode, and/or execute one or more instructions, for performing steps 1302, 1304, 1306, 1308, 1310. Various instructions can be stored in non-transitory storage medium of controller 122 and/or other control logic circuitry. The term "non-transitory" does not encompass transitory propagating signals. "Non-transitory" as used herein refers to any media that store data and/or instructions that cause a machine to operate in a specific fashion. Such non-transitory media may comprise non-volatile media and/or volatile media. Non-volatile media includes, for example, optical or magnetic disks. Volatile media includes dynamic memory. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same. As described in detail below, machine-readable storage medium of controller 102 or controller 206 (described further below), may be encoded with executable instructions, for example, instructions 1002-1010. Non-transitory media is distinct from but may be used in conjunction with transmission media. Transmission media participates in transferring information between non-transitory media. For example, transmission media includes coaxial cables, copper wire and fiber optics, including the wires that comprise bus between the controller 102 and a host. Transmission media can also take the form of acoustic or light waves, such as those generated during radio-wave and infra-red data communications.

Operations that make up method 1300 can include a step 1302 for generating a first pre-charging control signal. The first pre-charging control signal may be configured to pre-charge a first sense node, which may be sense node 630*b* of FIG. 6B. It should be understood that the first pre-charging control signal can at least partially pre-charge sense node 630*a* during pre-charge period 905 (FIG. 9). Step 1302 may include generating control signals 633*a* and 647*b* during pre-charge period 905, for example.

Operations of the method 1300 may include a step 1304 for generating a second pre-charging control signal. The second pre-charging control signal can be configured to pre-charge sense node 630*a* of FIG. 6B. For example, a signal can be applied at least at node 341. Step 1004 can include generating signals with reference to the period between pre-charge 905 and sensing 907.

Operations of the method 1300 may further include a step 1306 for generating a first sensing signal, the first sensing signal configured so that node 630*a* is selectively coupled to a current load (i.e. a memory cells) when nodes 630*a* and 630*b* are charged to first and second respective levels. Step 1306 can include performing sensing with reference to sensing period 907, including generating a sense enable signal for sense enable transistor 632*b*. A signal can be applied to node 641 during step 1306. Step 1306 may further include generating a charge sharing signal configured to decouple nodes 630*a* and 630*b* at or before node 630*a* is coupled to the current load. In other words, the current flowing to the memory cells can discharge node 630*a* but not node 630*b*. As the current load is a memory cell, if the cell is highly conductive, the voltage at the sense node 630*a* is less than the difference between the first transistor gate voltage and the threshold voltage of the first transistor. But, if the cell is non-conducting, in some embodiments, the voltage at sense node 630*a*.

Operations of method 1300 may still further include a step 1308 for generating a second sensing signal, where the second sensing signal may be configured to decouple node 630*a* from the current load (i.e. the memory cell(s)). Step 1308 can be performed when a charge accumulated at the node 630*a* decreases or stabilizes. Step 1308 can be performed until the sense enable transistor 632*b* is disabled. Step 1308 can include disabling the sense enable signal for sense enable transistor 632*b* as shown in FIG. 9.

Operations of the method 1300 may further include step 1310 for generating a first charge sharing signal. The first charge sharing signal can couple node 630*a* to node 630*b*. Nodes 630*a* and 630*b* can be coupled when node 630*a* is decoupled from the current load (e.g., the memory cell). Nodes 630*a* and 630*b* can be coupled for sharing a charge between nodes 630*a* and 630*b*. Charge sharing can include allowing the voltage level of node 630*b* to approximate or follow node 630*a*. The charge sharing signal may be configured to activate the transistor 633. As such, step 1310 can include activating the transistor 633. Step 1310 can include generating one or more signals as shown with reference to charging sharing period 909 in FIG. 9. As shown in FIG. 9, charge sharing may increase the sense margin.

Based on the voltage level of node 630b after the charge sharing between nodes 630a and 630b, the ON/OFF status of the memory cell may be detected. Based on the voltage level of node 630b after the charge sharing between nodes 630a and 630b, the conducting/non-conducting status of the memory cell may be detected. As such, node 630b can be latched, at least by activating a latching signal and/or at least by strobing the strobe transistor 336b (see also in the right hand side of FIG. 6).

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as memory system 100.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A circuit, comprising:
a sense circuit comprising a first sense node coupled to a second sense node via a transistor, wherein the sense circuit is configured to be coupled to a bitline of a memory cell, the sense circuit further comprising:
a first pre-charge circuit configured to pre-charge the first sense node to a first sense node pre-charge voltage level; and
a second pre-charge circuit configured to pre-charge the second sense node to a second sense node pre-charge voltage level,
wherein, responsive to activation, the first transistor is configured to enable charge sharing between the first sense node and the second sense node.

2. The circuit of claim 1, wherein the first transistor is activated responsive to a first transistor gate voltage applied to the first transistor being greater than a sum of a voltage at the first sense node and a threshold voltage of the first transistor.

3. The circuit of claim 2, further comprising a sense enable circuit coupled to the second sense node, wherein the sense enable circuit is configured to, responsive to the second sense node being pre-charged to the second sense node pre-charge voltage level, selectively discharge charge accumulated at the second sense node, and wherein the first transistor is configured to receive the first transistor gate voltage responsive to the charge accumulated at the second sense node being selectively discharged.

4. The circuit of claim 3, wherein the sense enable circuit selectively connects the sense circuit to the memory cell, and wherein the voltage at the second sense node is less than a difference between the first transistor gate voltage and the threshold voltage of the first transistor voltage if the memory cell is highly conductive.

5. The circuit of claim 1, wherein the first sense node has a larger capacitance than the second sense node, and wherein the first sense node performs a sensing operation and the second sense node provides a digitized representation of the sensing operation.

6. The circuit of claim 5, wherein the first transistor shares the charge between the first sense node and the second sense node based on the first sense node having a voltage that is less than a difference between a gate voltage of the first transistor and a threshold voltage of the first transistor.

7. The circuit of claim 6, wherein the difference between the gate voltage of the first transistor and the threshold voltage of the first transistor is less than a threshold voltage for a second transistor having a gate terminal connected to the second sense node, a source terminal connected to a rail voltage, and a drain terminal connected to a third transistor.

8. The circuit of claim 1, further comprising a latching circuit coupled to the first sensing node, the latching circuit configured to latch a voltage level of the first sensing node after the charge sharing between the first and second sensing nodes.

9. A circuit, comprising:
a first pre-charge circuit configured to pre-charge a first sensing node to a first voltage level;
a second sensing node;
a sensing circuit configured to selectively couple the second sensing node to a current load responsive to the first sensing node being charged to the first voltage level and the second sensing node being charged to a second voltage level, wherein the sensing circuit is further configured to decouple the second sensing node from the current load responsive to an accumulated charge at the second sensing node decreasing; and
a charge sharing circuit configured to decouple the first sensing node from the second sensing node responsive to the sensing circuit coupling the second sensing node to the current load and configured to couple the first sensing node to the second sensing node responsive to the second sensing node being decoupled from the current load.

10. The circuit of claim 9, wherein the charge sharing circuit comprises a transistor, and wherein the charge sharing circuit is configured to couple the first sensing node to the second sensing node responsive to a voltage level at the first sense node being less than a difference between a gate voltage applied to the first transistor and a threshold voltage of the first transistor.

11. The circuit of claim 9, further comprising a second pre-charge circuit, wherein the charge sharing circuit is configured to couple the first sensing node to the second sensing node so that the second sensing node is at least partially charged by the first pre-charge circuit, and wherein the second pre-charge circuit is configured to charge the second sensing node to a level greater than when at least partially charged by the first pre-charge circuit.

12. The circuit of claim 9, wherein the current load is a memory cell of a 3D NAND array.

13. A method, comprising:
generating a first pre-charging control signal, the first pre-charging control signal configured to pre-charge a first sensing node;
generating a first sensing signal, the first sensing signal configured to cause a second sensing node to be selectively coupled to a current load responsive to the first and second sensing nodes being charged to respective first and second levels;
generating a second sensing signal, the second sensing signal configured to decouple the second sensing node from the current load responsive to an accumulated charge at the second sensing node decreasing;
generating a first charge sharing signal, the first charge sharing signal configured to couple the first sensing node to the second sensing node responsive to the second sensing node being decoupled from the current load.

14. The method of claim 13, further comprising generating a second charge sharing signal, the second charge sharing signal being configured to decouple the first sensing node from the second sensing node responsive to coupling of the second sensing node to the current load.

15. The method of claim 13, further comprising detecting a voltage level at the second sensing node, wherein the first charge sharing signal is configured to activate a first transistor by applying a first transistor gate voltage to the first transistor, and wherein the first charge sharing signal is generated responsive to the voltage level at the second sensing node being less than a difference between the first transistor gate voltage and a threshold voltage of the first transistor.

16. The method of claim 15, wherein the current load is a memory cell, wherein application of the first sensing signal selectively couples the second node to the memory cell, and wherein the voltage at the second sensing node is less than the difference between the first transistor gate voltage and the threshold voltage of the first transistor only if the memory cell is highly conductive.

17. The method of claim 13, wherein generating the first charge sharing signal causes a voltage level at the first sensing node to approximate a voltage level at the second sensing node.

18. The method of claim 13, further comprising generating a latching signal configured to latch based on the voltage level of the first sensing node after the charge sharing between the first and second sensing nodes.

19. The method of claim 13, wherein the current load is a memory cell, the method further comprising:
detecting the voltage level at the first sensing node after generating the charge sharing signal, wherein the voltage level at the first sensing node is indicative of whether the memory cell is highly conductive or non-conductive.

20. The method of claim 13, further comprising generating a second pre-charging control signal, the second pre-charging control signal being configured to charge the second sensing node to the second respective level.

* * * * *